(12) United States Patent
Yamahira

(10) Patent No.: US 7,777,557 B2
(45) Date of Patent: Aug. 17, 2010

(54) BOOSTER CIRCUIT

(75) Inventor: Seiji Yamahira, Kyoto (JP)

(73) Assignee: Panasonic Corporation, Osaka (JP)

( * ) Notice: Subject to any disclaimer, the term of this patent is extended or adjusted under 35 U.S.C. 154(b) by 147 days.

(21) Appl. No.: 12/015,882

(22) Filed: Jan. 17, 2008

(65) Prior Publication Data

US 2008/0169864 A1 Jul. 17, 2008

(30) Foreign Application Priority Data

Jan. 17, 2007 (JP) ............................. 2007-007694
Nov. 28, 2007 (JP) ............................. 2007-307064

(51) Int. Cl.
*G05F 1/10* (2006.01)

(52) U.S. Cl. ................................................... 327/536

(58) Field of Classification Search ................. 327/535, 327/536, 537
See application file for complete search history.

(56) References Cited

U.S. PATENT DOCUMENTS

| | | | |
|---|---|---|---|
| 6,100,557 A | 8/2000 | Hung et al. | |
| 6,121,821 A | 9/2000 | Miki | |
| 6,501,325 B1 * | 12/2002 | Meng | 327/536 |
| 6,734,717 B2 | 5/2004 | Min | |
| 6,878,981 B2 | 4/2005 | Eshel | |
| 6,888,400 B2 | 5/2005 | Lin et al. | |
| 6,952,129 B2 | 10/2005 | Lin et al. | |
| 7,102,422 B1 | 9/2006 | Sawada et al. | |
| 7,123,077 B2 | 10/2006 | Chiu et al. | |
| 7,317,347 B2 * | 1/2008 | Mensi et al. | 327/536 |
| 7,532,062 B2 * | 5/2009 | Namekawa et al. | 327/536 |
| 2007/0096796 A1 | 5/2007 | Firmansyah et al. | |

* cited by examiner

*Primary Examiner*—Jeffrey S Zweizig
(74) *Attorney, Agent, or Firm*—McDermott Will & Emery LLP

(57) ABSTRACT

A boosting circuit comprises a first boosting cell row and a second boosting cell row. The boosting circuit further comprises an analog comparison circuit for comparing the potential of boosting cells on the same stage, and selecting and outputting the lower or higher of the potentials. The potential of an N well is controlled using the output potential of the analog comparison circuit. Thereby, the amplitude of an N well potential can be suppressed, and a single N well region can be shared.

15 Claims, 21 Drawing Sheets

BOOSTER CIRCUIT

BACKGROUND OF THE INVENTION

1. Field of the Invention

The present invention relates to a booster circuit employing a switching element having a triple-well structure.

2. Description of the Related Art

In recent years, flash memories, which are a type of nonvolatile semiconductor memory devices, require data read and data write using a single power supply voltage or low power supply voltages, for which, therefore, a booster circuit for supplying a positive or negative boosted voltage is required on a chip when each operation is performed. Also, during CMOS processes, a power supply voltage generated by the booster circuit is used to improve characteristics of an analog circuit.

Conventionally, there is a known booster circuit employing a triple-well structure switching element (U.S. Pat. Nos. 6,100,557, 6,121,821, and 7,102,422).

FIG. 25 shows an exemplary conventional booster circuit. In FIG. 25, 901 indicates a booster circuit which receives two-phase clock signals CLK1 and CLK2 and generates an output terminal voltage (boosted voltage) Vpump by a boosting operation. 902, 903, and 904 are boosting cells which constitute an exemplary three-stage configuration, where CLK1 is input to the odd-numbered-stage cells and CLK2 is input to the even-numbered-stage cell. 905 indicates a backflow preventing circuit which prevents backflow of the boosted voltage Vpump. 906 indicates a charge transfer transistor which functions as a switching element. 907 indicates a P well (PW) of the charge transfer transistor 906. 908 indicates a deep N well (NT) including the P well 907. 909 indicates a parasitic diode between the P well 907 and the N well 908. 910 indicates boosting capacitors which boost output terminals of the boosting cells 902, 903, and 904. 911, 912, 913, and 914 indicate I/O terminals of the boosting cells. As shown in FIG. 25, the P well 907 and the N well 908 of each charge transfer transistor 906 of the boosting cells 902 to 904 is connected to the source of the charge transfer transistor 906 so that they have the same potential.

FIG. 26 is a waveform diagram showing the two-phase clock signals CLK1 and CLK2 in the booster circuit 901 of FIG. 25. An operation of the booster circuit 901 of FIG. 25 will be briefly described with reference to FIG. 26.

Initially, at time T1, CLK1 goes to "H" (power supply voltage Vdd) and CLK2 goes to "L" (ground voltage Vss), so that the potentials of the I/O terminals 912 and 914 are boosted. At the same time, changes are transferred from the I/O terminal 912 to the I/O terminal 913 and from the I/O terminal 914 to the output terminal of the booster circuit 901, via the charge transfer transistors 906 of the boosting cell 903 and the backflow preventing circuit 905, respectively, so that the output terminal voltages of the I/O terminal 913 and the booster circuit 901 are increased. In this case, since the P well 907 of each of the boosting cell 903 and the backflow preventing circuit 905 has the same potential as that of the source terminal of the charge transfer transistor 906, the substrate biasing effect of the charge transfer transistor 906 is suppressed, thereby making it possible to suppress a decrease in charge transfer efficiency.

At time T2 when a charge transfer period Ttrans has been passed since time T1, CLK2 goes to "H" and CLK1 goes to "L", so that the potential of the I/O terminal 913 is boosted. At the same time, charges are transferred from the I/O terminal 913 to the I/O terminal 914 via the charge transfer transistor 906 of the boosting cell 904. In this case, since the P well 907 of the boosting cell 904 has the same potential as that of the source terminal of the charge transfer transistor 906, the substrate biasing effect of the charge transfer transistor 906 is suppressed, thereby making it possible to suppress a decrease in charge transfer efficiency.

At time T3, an operation similar to that at time T1 is performed.

Thus, according to the booster circuit 901 of FIG. 25, the substrate biasing effect is suppressed, thereby making it possible to suppress a decrease in charge transfer efficiency during the boosting operation.

However, in the conventional booster circuit 901, the source and the N well 908 of the charge transfer transistor 906 are connected to each other, so that a parasitic capacitance formed by the N well 908 is charged and discharged by voltage transition widths of the clock signals CLK1 and CLK2 in response to voltage transitions of the clock signals CLK1 and CLK2.

Also, charges supplied by the clock signals CLK1 and CLK2 are used to charge and discharge the N well 908, disadvantageously resulting in a decrease in boost efficiency.

Also, since the source and the N well 908 of the charge transfer transistor 906 are connected to each other, it is necessary to separate the N wells 908 of the charge transfer transistors 906 from each other, disadvantageously resulting in an increase in layout area.

SUMMARY OF THE INVENTION

An object of the present invention is to provide a booster circuit in which the current consumption and the layout area can be suppressed while the substrate biasing effect of a switching element used in each boosting cell can be suppressed.

To achieve the object, a booster circuit according to the present invention is provided in which the potential of an N well of each boosting cell is fixed to the input or output potential of the boosting cell stage to reduce the amount of charges which are charged and discharged between the N well and the substrate, thereby making it possible to improve the boost efficiency.

Specifically, in a first aspect, a boosting circuit comprises boosting cells each having a first-conductivity type first well region on a substrate, a second-conductivity type second well region in the first well region, and at least one switching element in the first well region or the second well region, in which the at least one switching element switches ON/OFF a connection between a first terminal and a second terminal so as to transfer charges from the first terminal to the second terminal, a first boosting cell row including N stages ($N \geq 1$) of the boosting cells, a second boosting cell row including M stages ($M \geq 1$) of the boosting cells, and at least one analog comparison circuit for outputting the higher or lower of an output potential of the boosting cell on the i-th stage ($1 \leq i \leq N$) of the first boosting cell row and an output potential of the boosting cell on the i-th stage ($1 \leq i \leq M$) of the second boosting cell row. The output potential of the at least one analog comparison circuit is applied to the first well region of the at least one switching element included in the boosting cell on the (i+1)-th stage, the boosting cell on the i-th stage, or at least one of the boosting cells on less than i-th stages of the first and second boosting cell rows.

In a second aspect, a booster circuit comprises boosting cells each having a first-conductivity type first well region on a substrate, a second-conductivity type second well region in the first well region, and at least one switching element in either or both of the first well region and the second well region, in which the at least one switching element switches ON/OFF a connection between a first terminal and a second terminal so as to transfer charges from the first terminal to the second terminal, a first boosting cell row including N stages (N≧1) of the boosting cells, a second boosting cell row including M stages (M≧1) of the boosting cells, and at least one analog comparison circuit for outputting the higher or lower of an input potential of the boosting cell on the i-th stage (1≦i≦N) of the first boosting cell row and an input potential of the boosting cell on the i-th stage (1≦i≦M) of the second boosting cell row. The output potential of the at least one analog comparison circuit is applied to the first well region of the at least one switching element included in the boosting cell on the (i+1)-th stage, the boosting cell on the i-th stage, or at least one of the boosting cells on less than i-th stages of the first and second boosting cell rows.

In a third aspect, a booster circuit comprises boosting cells and backflow preventing circuits each having a first-conductivity type first well region on a substrate, a second-conductivity type second well region in the first well region, and at least one switching element in the first well region or the second well region, wherein the at least one switching element switches ON/OFF a connection between a first terminal and a second terminal so as to transfer charges from the first terminal to the second terminal, a first boosting cell row including N stages (N≧1) of the boosting cells and the backflow preventing circuit, a second boosting cell row including M stages (M≧1) of the boosting cells and the backflow preventing circuit, and at least one analog comparison circuit for outputting the higher or lower of an output potential of the boosting cell on the i-th stage (1≦i≦N) of the first boosting cell row and an output potential of the boosting cell on the i-th stage (1≦i≦M) of the second boosting cell row. The output potential of the at least one analog comparison circuit is applied to the first well region of the at least one switching element included in the backflow preventing circuit, the boosting cell on the (i+1)-th stage, the boosting cell on the i-th stage, or at least one of the boosting cells on less than i-th stages of the first and second boosting cell rows.

In a fourth aspect, a booster circuit comprises boosting cells and backflow preventing circuits each having a first-conductivity type first well region on a substrate, a second-conductivity type second well region in the first well region, and at least one switching element in either or both of the first well region and the second well region, in which the at least one switching element switches ON/OFF a connection between a first terminal and a second terminal so as to transfer charges from the first terminal to the second terminal, a first boosting cell row including N stages (N≧1) of the boosting cells and the backflow preventing circuit, a second boosting cell row including M stages (M≧1) of the boosting cells and the backflow preventing circuit, and at least one analog comparison circuit for outputting the higher or lower of an intermediate potential of the backflow preventing circuit of the first boosting cell row and an intermediate potential of the backflow preventing circuit of the second boosting cell row. The output potential of the at least one analog comparison circuit is applied to the first well region of the at least one switching element included in the backflow preventing circuit of the first and second boosting cell rows or at least one of the boosting cells of the first and second boosting cell rows.

In a fifth aspect, a booster circuit comprises boosting cells and backflow preventing circuits each having a first-conductivity type first well region on a substrate, a second-conductivity type second well region in the first well region, and at least one switching element in either or both of the first well region and the second well region, in which the at least one switching element switches ON/OFF a connection between a first terminal and a second terminal so as to transfer charges from the first terminal to the second terminal, a first boosting cell row including N stages (N≧1) of the boosting cells and the backflow preventing circuit, a second boosting cell row including M stages (M≧1) of the boosting cells and the backflow preventing circuit, and at least one analog comparison circuit for comparing input potentials of the boosting cells on the i-th stages (1≦i≦N) of the first and second boosting cell rows or the backflow preventing circuits and outputting the higher or lower of the input potentials. The output potential of the at least one analog comparison circuit is applied to the first well region of the at least one switching element included in the backflow preventing circuit, the boosting cell on the (i+1)-th stage, the boosting cell on the i-th stage, or at least one of the boosting cells on less than i-th stages of the first and second boosting cell rows.

In a sixth aspect, in the booster circuit of any one of the first to fifth aspects, the second well region and the first terminal are connected to each other so that the second well region and the first terminal have the same potential.

In a seventh aspect, in the booster circuit of any one of the first to fifth aspects, the second well region and the first well region are connected to each other so that the second well region and the first well region have the same potential.

In an eighth aspect, in the booster circuit of any one of the first to fifth aspects, the at least one analog comparison circuit has a first-conductivity type first well region on the substrate, a second-conductivity type second well region in the first well region, and at least one switching element in the first well region or the second well region, and the at least one analog comparison circuit is provided one for each boosting cell stage.

In a ninth aspect, in the booster circuit of any one of the first to fifth aspects, the at least one analog comparison circuit has a first-conductivity type first well region on the substrate, a second-conductivity type second well region in the first well region, and at least one switching element in the first well region or the second well region, and the at least one analog comparison circuit is provided one every arbitrary number of boosting cell stages.

In a tenth aspect, in the booster circuit of any one of the first to fifth aspects, a diode element is provided between the first terminal and the first well region of the boosting cell.

In an eleventh aspect, in the booster circuit of any one of the first to fifth aspects, the at least one switching elements having the same potential of the first well region of the first and second boosting cell rows share a common first well region.

In a twelfth aspect, in the booster circuit of any one of the first to fifth aspects, the at least one switching elements having the same potential of the first well region of the first and second boosting cell rows and the at least analog comparison circuit share a common first well region.

In a thirteenth aspect, in the booster circuit of any one of the first to fifth aspects, the at least one switching circuit of the boosting cell on the i-th stage of the first boosting cell row and a first element of the at least analog comparison circuit share a common first well region, and the at least one switching circuit of the boosting cell on the i-th stage of the second boosting cell row and a second element of the at least analog comparison circuit share a common first well region.

According to the first aspect, the amount of charges which are charged and discharged in the first-conductivity type first well region can be caused to be smaller than the voltage swing of a clock signal, so that the apparent parasitic capacitance between the first well region and the substrate can be reduced. Thereby, it is possible to suppress current consumption during a boosting operation. Also, since the apparent parasitic capacitance between the first well region and the substrate can be reduced, boost efficiency can be improved. Also, by controlling the potentials of the first well regions of a plurality of boosting cells using a single analog comparison circuit, it is possible to suppress an increase in layout area due to the analog comparison circuit.

According to the second aspect, a well control can be performed using the input potential of a boosting cell on the first stage, so that a load capacitance connected to a boosting capacitor on each stage can be caused to be uniform. Thereby, a more stable boosting operation can be achieved.

According to the third aspect, the potential of the first well region of the backflow preventing circuit can be controlled, thereby making it possible to suppress a decrease in charge transfer efficiency of the backflow preventing circuit.

According to the fourth aspect, a well control can be performed using an intermediate potential of the backflow preventing circuit, so that a load capacitance connected to a boosting capacitor on each stage can be caused to be uniform. Thereby, a more stable boosting operation can be achieved.

According to the fifth aspect, a well control can be performed using the input potential of a boosting cell on the first stage, so that a load capacitance connected to a boosting capacitor on each stage can be caused to be uniform. Thereby, a more stable boosting operation can be achieved.

According to the sixth aspect, the input terminal and the second well region of a charge transfer transistor (switching element) in the boosting cell can be connected to each other, so that the current drive performance of a switching element can be suppressed from being decreased due to the substrate biasing effect.

According to the seventh aspect, the first well region and the second well region are caused to have the same potential, so that a single well region can be shared by an N-channel transistor and a P-channel transistor, resulting in a decrease in layout area.

According to the eighth aspect, an analog comparison circuit is provided for each of all stages, so that the boosting cells can be caused to be of uniform parasitic capacitance, thereby making it possible to improve easiness of design.

According to the ninth aspect, an analog comparison circuit is provided every arbitrary number of stages, so that an increase in circuit area can be suppressed while securing the margins of the breakdown voltages of the second well region and the first well region.

According to the tenth aspect, by supplying the input potential of a boosting cell to the first well region via a diode element, the potential increase of the first well region is caused to follow each boosting cell potential during start up of a booster circuit, thereby making it possible to prevent the occurrence of latch-up.

According to the eleventh and twelfth aspects, a common first well region is used, thereby making it possible to reduce the layout area.

According to the thirteenth aspect, noise interference between the first boosting cell row and the second boosting cell row which is pumped with clocks having different phases can be reduced while reducing the amount of charges which are charged and discharged of the first well region.

DETAILED DESCRIPTION OF THE PREFERRED EMBODIMENTS

Hereinafter, a booster circuit according to the present invention will be described, by way of examples, with reference to the accompanying drawings.

Figure 1:
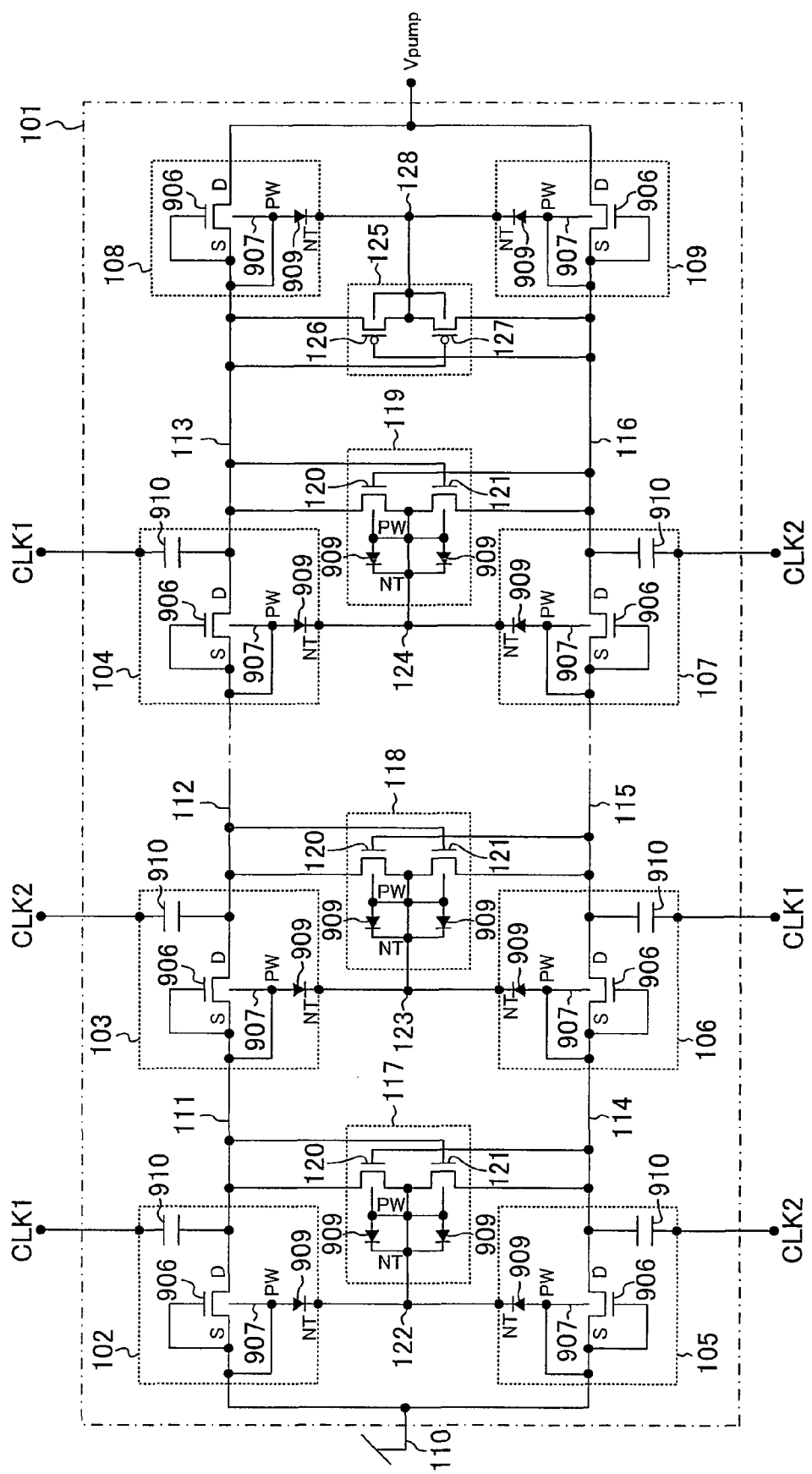
FIG. 1 is a circuit diagram showing an exemplary configuration of a booster circuit according to the present invention.

FIG. 1 shows an exemplary configuration of the booster circuit of the present invention. In FIG. 1, 101 indicates a two-parallel booster circuit which receives two-phase clock signals CLK1 and CLK2 and generates an output terminal voltage (boosted voltage) Vpump by a boosting operation. 102, 103, 104, 105, 106, and 107 indicate boosting cells which are arranged in a first line and a second line, where CLK1 is input to the odd-numbered stages on the first line and the even-numbered stages on the second line, and CLK2 is input to the even-numbered stages on the first line and the odd-numbered stages on the second line. 108 and 109 indicate backflow preventing circuits which prevent backflow of the boosted voltage Vpump. 110, 111, 112, 113, 114, 115, and 116 indicate I/O terminals of the boosting cells 102 to 107. 117, 118, and 119 indicate exemplary low-voltage output analog comparison circuits which output the lower of the voltages of the I/O terminals of the boosting cells on the same stage of the first line and the second line. 120 and 121 indicate Nch (N-channel) transistors included in the low-voltage output analog comparison circuits 117, 118, and 119. 122, 123, and 124 indicate output terminals of the low-voltage output analog comparison circuits 117 to 119 connected to N wells of the corresponding boosting cells. 125 indicates a high-voltage output analog comparison circuit which outputs the higher of the voltages of the I/O terminal 113 of the third-stage boosting cell 104 on the first line and the I/O terminal 116 of the third-stage boosting cell 107 on the second line. 126 and 127 indicate Pch (P-channel) transistors included in the high-voltage output analog comparison circuit 125. 128 indicates an output terminal of the high-voltage output analog comparison circuit connected to N wells of the backflow preventing circuits 108 and 109. Note that the same elements as those of the above-described conventional example are indicated by the same reference numerals. Also, the number of boosting cells connected in series in the booster circuit 101 shown in FIG. 1 is only for illustrative purposes.

Figure 26:
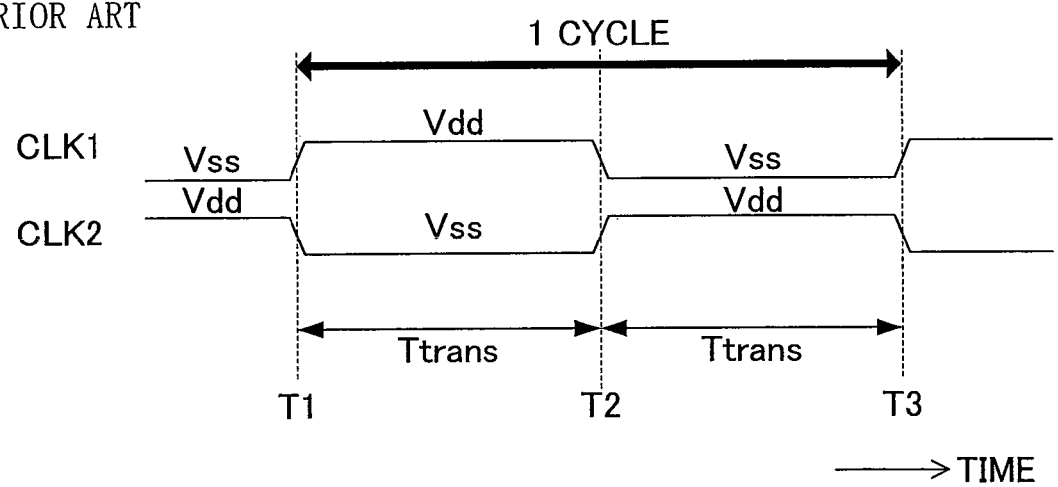
FIG. 26 is a waveform diagram showing a two-phase clock signal in the booster circuit of FIG. 25.

The two-phase clock signals CLK1 and CLK2 of the booster circuit 101 of FIG. 1 have waveforms similar to those of FIG. 26. An operation of the booster circuit 101 of FIG. 1 will be described with reference to FIG. 26.

At time T1, CLK1 goes from "L" to "H" and CLK2 goes from "H" to "L", so that the potentials of the I/O terminals 111, 113, and 115 of the boosting cells 102, 104, and 106 are boosted, and the boosted charges are transferred via the charge transfer transistors 906 of the boosting cell 103, the backflow preventing circuit 108, and the boosting cell 107 to the I/O terminal 112, the output terminal of the booster circuit 101, and the I/O terminal 116, respectively. In this case, in the low-voltage output analog comparison circuit 117, the Nch transistor 120 is switched OFF and the Nch transistor 121 is switched ON due to a relationship in potential between the boosted I/O terminal 111 and the non-boosted I/O terminal 114, so that the potential of the I/O terminal 114 is output from the output terminal 122 of the low-voltage output analog comparison circuit 117 and is supplied to the N wells of the boosting cell 102 and the boosting cell 105. Similarly, the potential of the I/O terminal 112 is output from the output terminal 123 of the low-voltage output analog comparison circuit 118 and is supplied to the N wells of the boosting cell 103 and the boosting cell 106. The potential of the I/O terminal 116 is output from the output terminal 124 of the low-voltage output analog comparison circuit 119 and is supplied to the N wells of the boosting cells 104 and the boosting cell 107. Also, in the high-voltage output analog comparison circuit 125, the Pch transistor 126 is switched ON and the Pch transistor 127 is switched OFF due to a relationship in potential between the boosted I/O terminal 113 and the non-boosted I/O terminal 116, so that the potential of the I/O terminal 113 is output from the output terminal 128 of the high-voltage output analog comparison circuit 125 and is supplied to the N wells of the backflow preventing circuit 108 and the backflow preventing circuit 109.

At time T2, if CLK1 goes from "H" to "L" and CLK2 goes from "L" to "H", the potentials of the I/O terminals 112, 114, and 116 of the boosting cells 103, 105, and 107 are boosted, and boosted charges are transferred via the charge transfer transistors 906 of the boosting cells 104 and 106 and the backflow preventing circuit 109 to the output terminals of the I/O terminals 113 and 115 and the booster circuit 101, respectively. In this case, in the low-voltage output analog comparison circuit 117, the Nch transistor 120 is switched ON and the Nch transistor 121 is switched OFF due to a relationship in potential between the boosted I/O terminal 114 and the non-boosted I/O terminal 111, so that the potential of the I/O terminal 111 is output from the output terminal 122 of the low-voltage output analog comparison circuit 117 and is supplied to the N wells of the boosting cell 102 and the boosting cell 105. Similarly, the potential of the I/O terminal 115 is output from the output terminal 123 of the low-voltage output analog comparison circuit 118 and is supplied to the N wells of the boosting cell 103 and the boosting cell 106. The potential of the I/O terminal 113 is output from the output terminal 124 of the low-voltage output analog comparison circuit 119 and is supplied to the N wells of the boosting cell 104 and the boosting cell 107. Also, in the high-voltage output analog comparison circuit 125, the Pch transistor 126 is switched OFF and the Pch transistor 127 is switched ON due to a relationship in potential between the boosted I/O terminal 116 and the non-boosted I/O terminal 113, so that the potential of the I/O terminal 116 is output from the output terminal 128 of the high-voltage output analog comparison circuit 125 and is supplied to the N wells of the backflow preventing circuit 108 and the backflow preventing circuit 109.

Thus, according to the booster circuit 101 of FIG. 1, the potentials of the N wells of the boosting cells 102 to 107 and the backflow preventing circuits 108 and 109 can be fixed to the input potentials or the output potentials of the respective boosting cell stage, so that the amount of charges which are charged and discharged between the N well and the substrate can be reduced, i.e., current consumption can be reduced. Also, by reducing the amount of charges which are charged and discharged between the N well and the substrate, the amount of charges transferred to the next stage can be increased, so that an improvement in boost efficiency can be expected.

Figure 2:
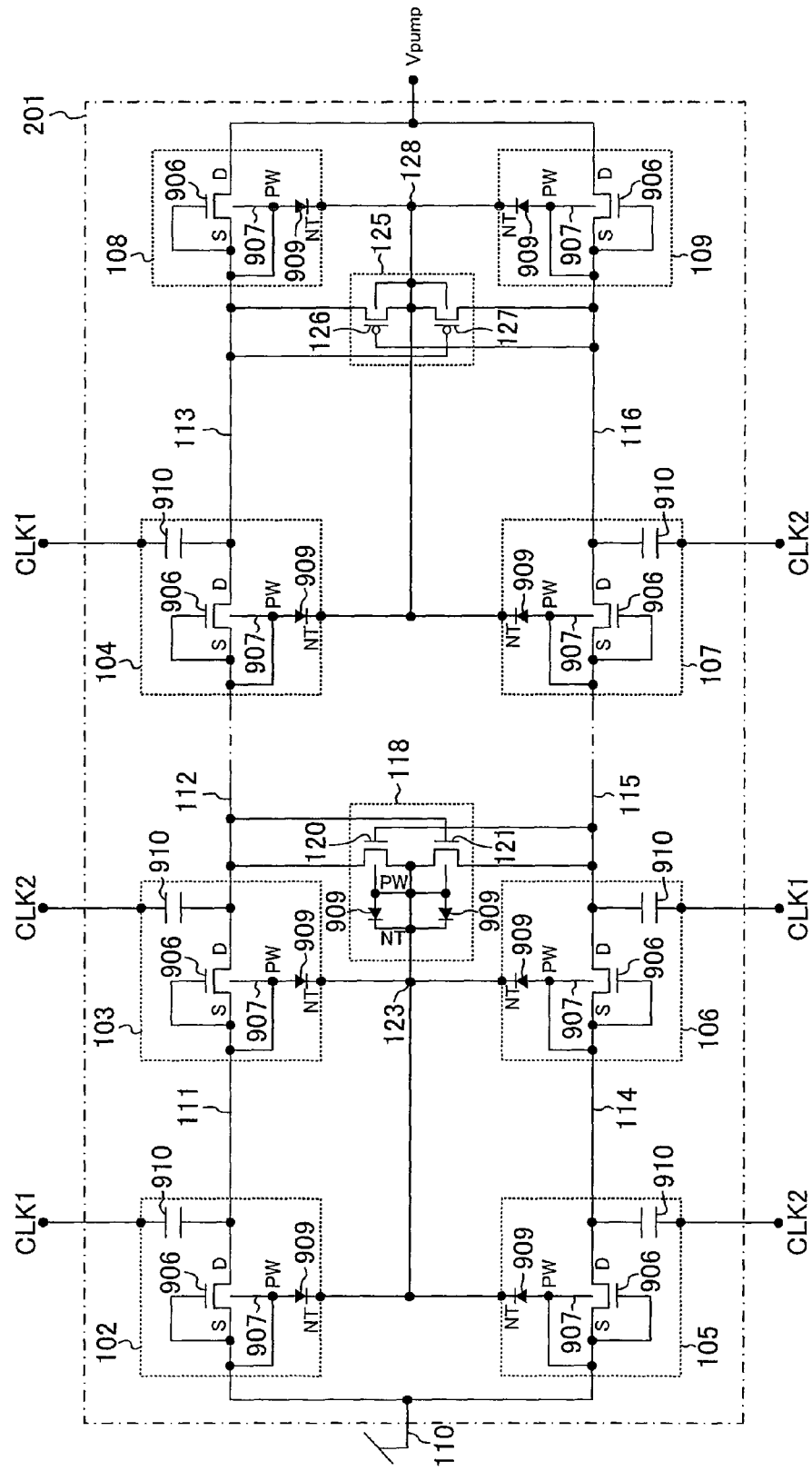
FIG. 2 is a circuit diagram showing another exemplary configuration of a booster circuit according to the present invention.
Figure 3:
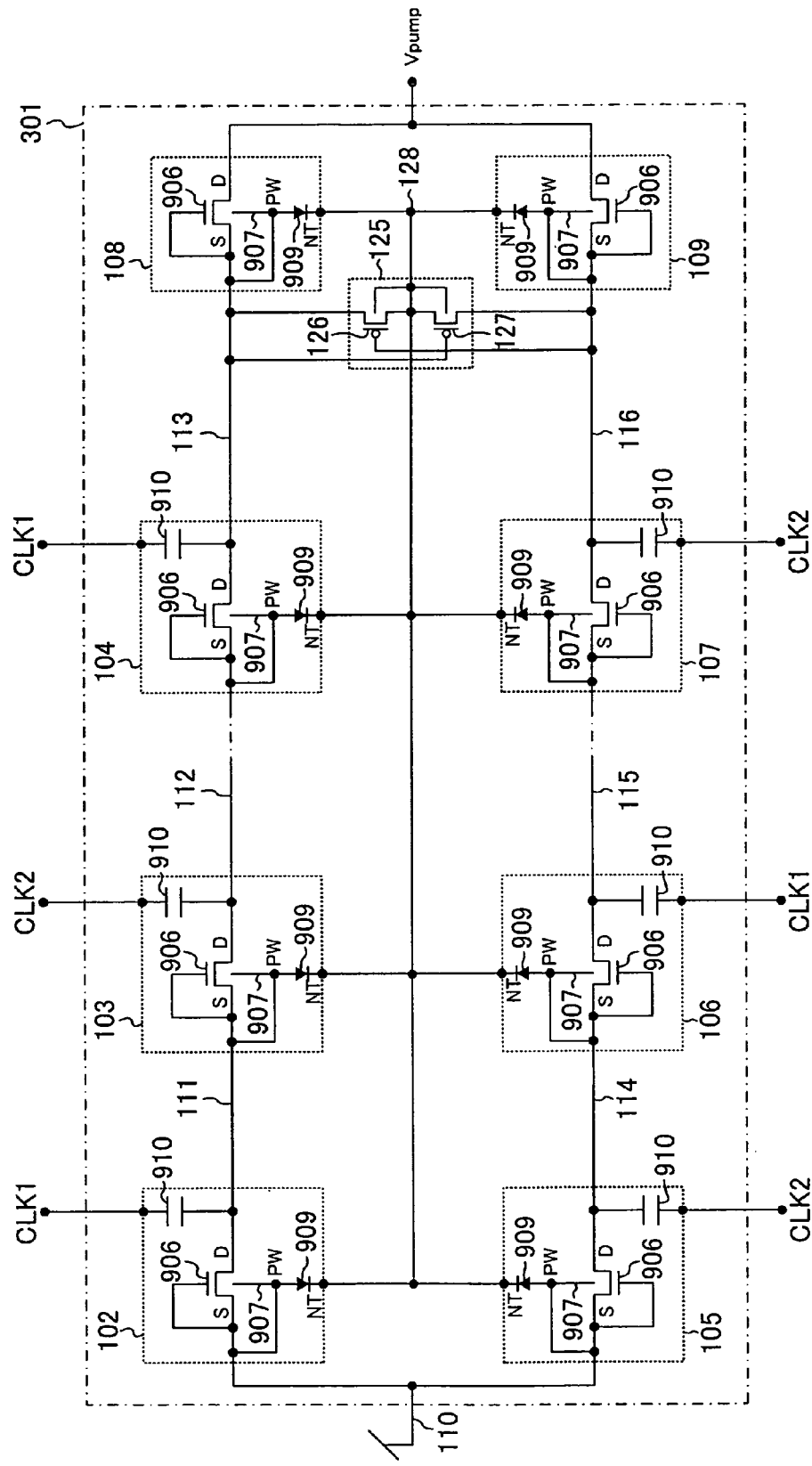
FIG. 3 is a circuit diagram showing still another exemplary configuration of the booster circuit of the present invention.

Note that, as shown in FIGS. 2 and 3, the low-voltage output analog comparison circuits 117 to 119 and the high-voltage output analog comparison circuit 125 can be provided every arbitrary number of stages of boosting cells, taking into consideration the margin of the breakdown voltage between the P well and the N well and the circuit area, so that an effect similar to that of the above-described configuration can be obtained with a reduced number of elements.

Figure 4:
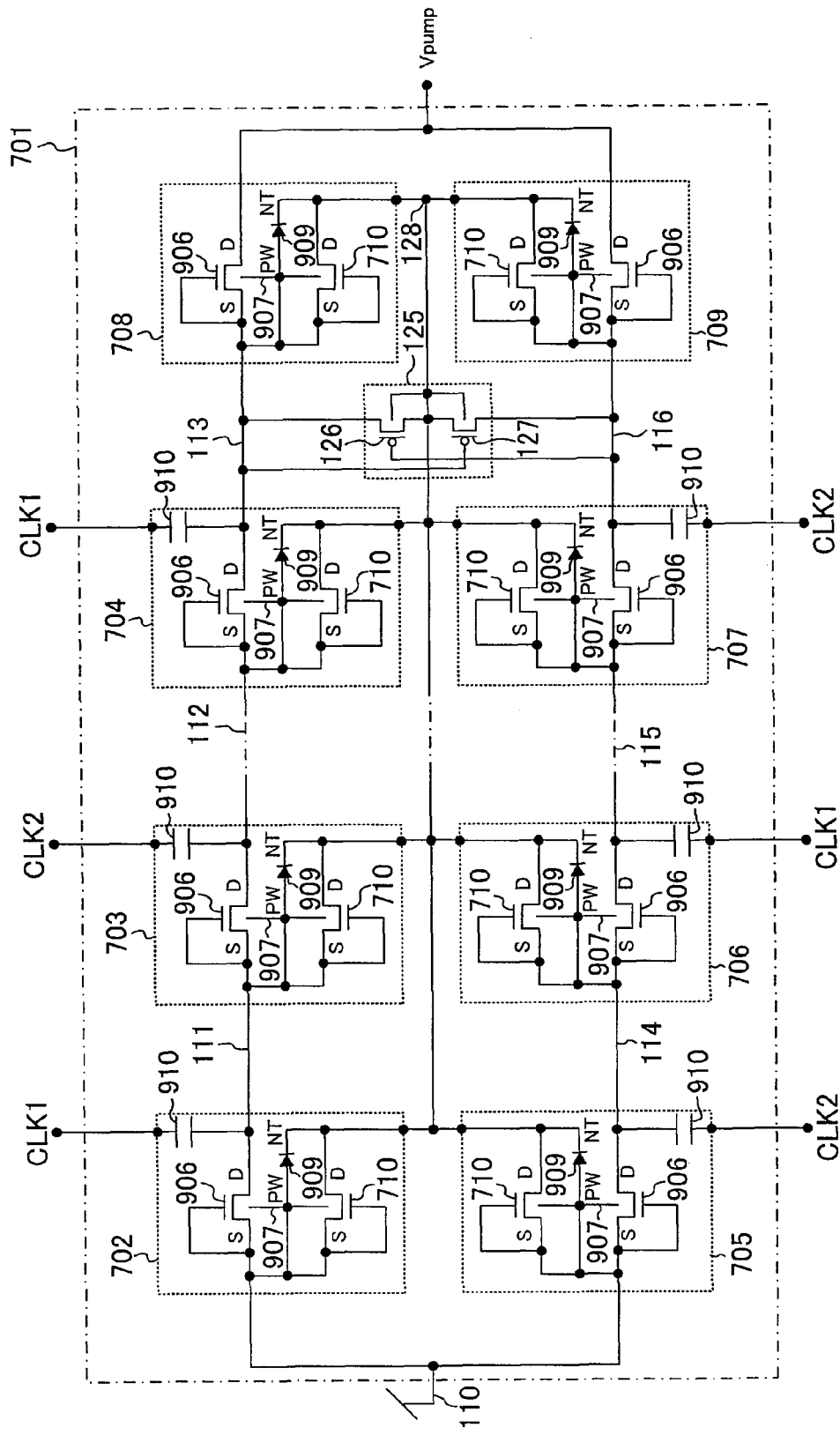
FIG. 4 is a circuit diagram showing still another exemplary configuration of the booster circuit of the present invention.

FIG. 4 shows another exemplary configuration of the booster circuit of the present invention. In FIG. 4, 701 indicates a two-parallel booster circuit which receives two-phase clock signals CLK1 and CLK2, and generates a boosted voltage Vpump by a boosting operation. 702, 703, 704, 705, 706, and 707 indicate the boosting cells 102 to 107 of FIG. 1, respectively, in each of which a transistor 710 diode-connected between the I/O terminal of the boosting cell and the output terminal 128 of the high-voltage output analog comparison circuit 125 is added. 708 and 709 indicate backflow preventing circuits. Note that elements similar to those of FIG. 1 are indicated by the same reference numerals. The number of boosting cells connected in series in the booster circuit 701 is only for illustrative purposes.

The configuration of FIG. 4 is different from that of FIG. 1 in that the low- (or high-) voltage output analog comparison circuits 117 to 119 and 125 are replaced with a single common element, thereby reducing the number of elements. Thereby, during startup of the booster circuit 701, when the potentials of the I/O terminals 111 to 116 of the boosting cells 702 to 707 increase, the N well potential is supplied as a forward current of the parasitic diode 909 from the P well 907 of each of the boosting cells 702 to 707. To suppress the forward current of the parasitic diode 909, the transistor 710 having a diode function is provided, thereby making it possible to provide a stable boosting operation even during startup of the booster circuit 701.

Figure 5:
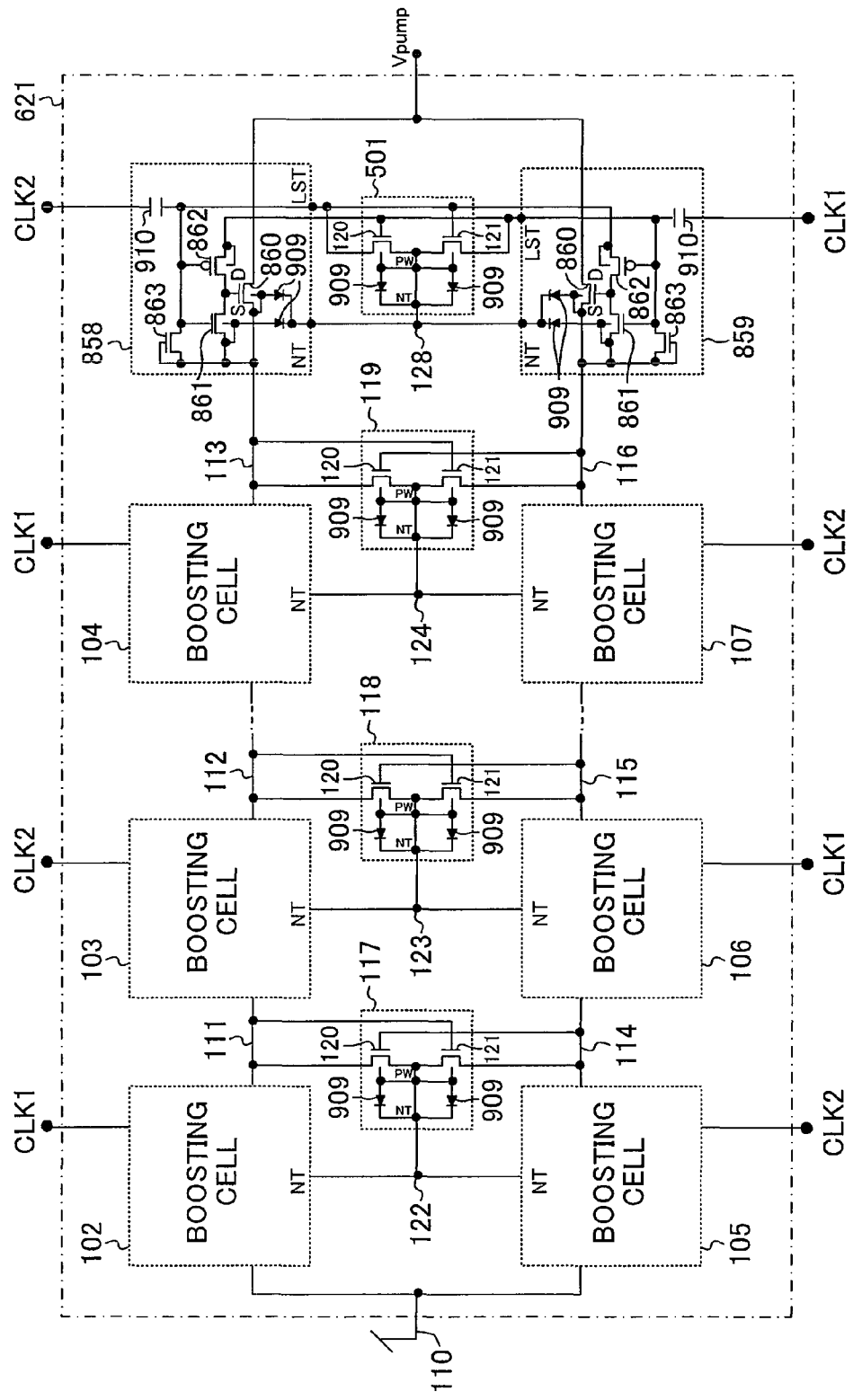
FIG. 5 is a circuit diagram showing still another exemplary configuration of the booster circuit of the present invention.

FIG. 5 shows still another exemplary configuration of the booster circuit of the present invention. In FIG. 5, 621 indicates a two-parallel booster circuit which receives two-phase clock signals CLK1 and CLK2, and generates a boosted voltage Vpump by a boosting operation. 858 and 859 indicate backflow preventing circuits in which two-phase clock signals CLK1 and CLK2 are input and transistors 861 and 862 therein are controlled to cause a charge transfer transistor 860 to be in a conductive or non-conductive state. Thereby, a decrease in transfer efficiency occurring in the backflow preventing circuits 108 and 109 of FIG. 1 is suppressed. Note that elements similar to those of FIG. 1 are indicated by the same reference numerals. The number of boosting cells connected in series in the booster circuit 621 is only for illustrative purposes.

The configuration of FIG. 5 is different from that of FIG. 5 in that the two-phase clock signals CLK1 and CLK2 are input to control the gate potential of the charge transfer transistor 860, and a low-voltage output analog comparison circuit 501 is used for the backflow preventing circuits 858 and 859 for improving charge transfer efficiency and boost efficiency.

According to FIG. 5, the low-voltage output analog comparison circuits 117, 118, 119, and 501 having a similar structure are provided on the respective stages in the booster circuit 621, so that a difference between the loads of the boosting capacitors 910 of the boosting cells 104 and 107 on the final stage of FIG. 1 and the loads of the boosting capacitors 910 of the other boosting cells 102, 103, 105, and 106 can be suppressed, thereby making it possible to cause the boosting capacitors 910 on the stages to be of substantially uniform parasitic capacitance. Therefore, the boosting cells on the stages are caused to be of uniform charge transfer amount, resulting in a stable boosting operation.

Figure 6:
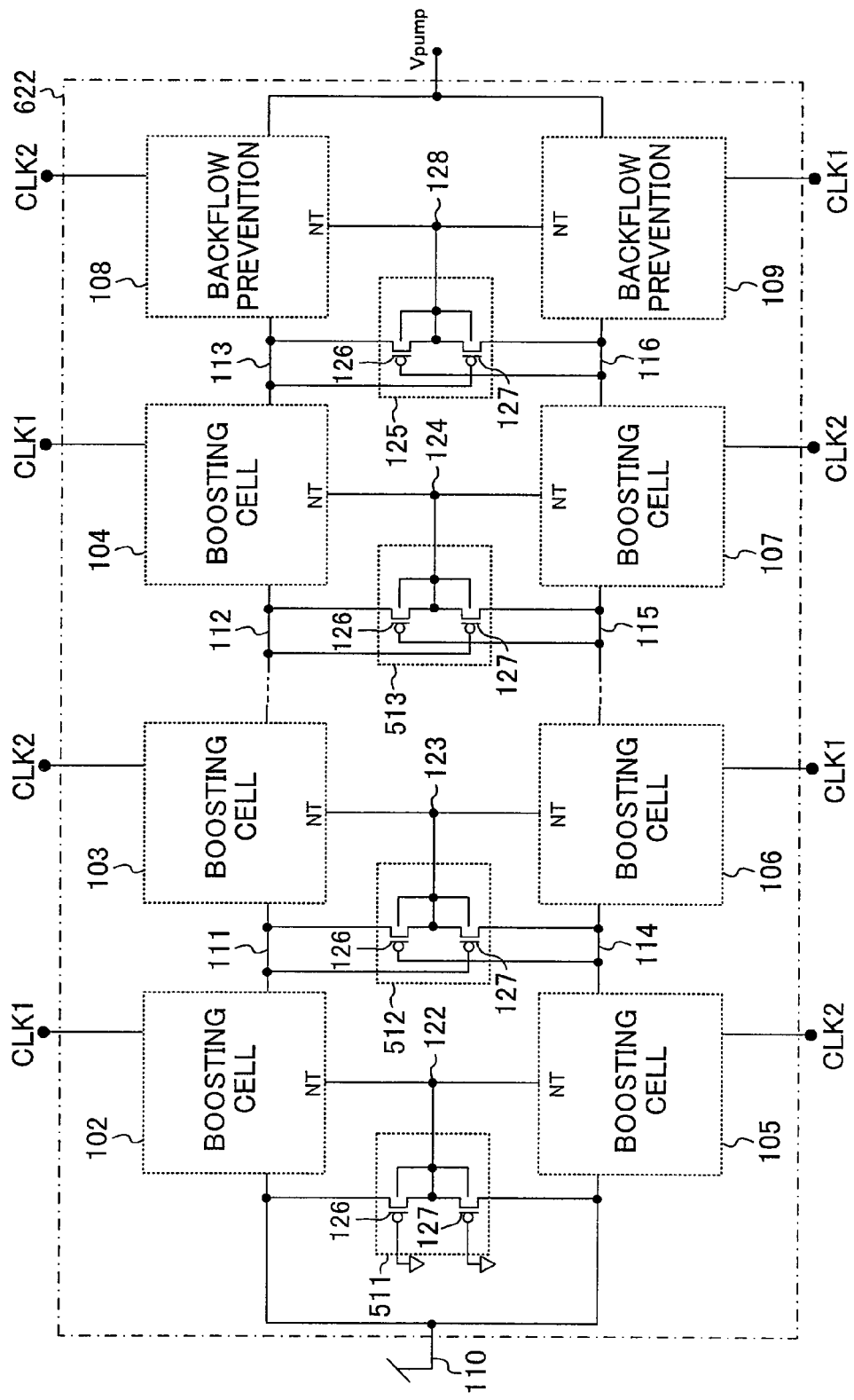
FIG. 6 is a circuit diagram showing still another exemplary configuration of the booster circuit of the present invention.

Note that a booster circuit 622 of FIG. 6 is an example in which high-voltage output analog comparison circuits 511, 512, 513, and 125 are used for the boosting cells 102 to 107 and the backflow preventing circuits 108 and 109 of FIG. 1, and only the gates of the transistors 126 and 127 of the high-voltage output analog comparison circuit 511 which controls the N wells of the boosting cells 102 and 105 on the first stage are fixed to VSS. Thereby, a stable boosting operation can be achieved as in FIG. 5.

Figure 7:
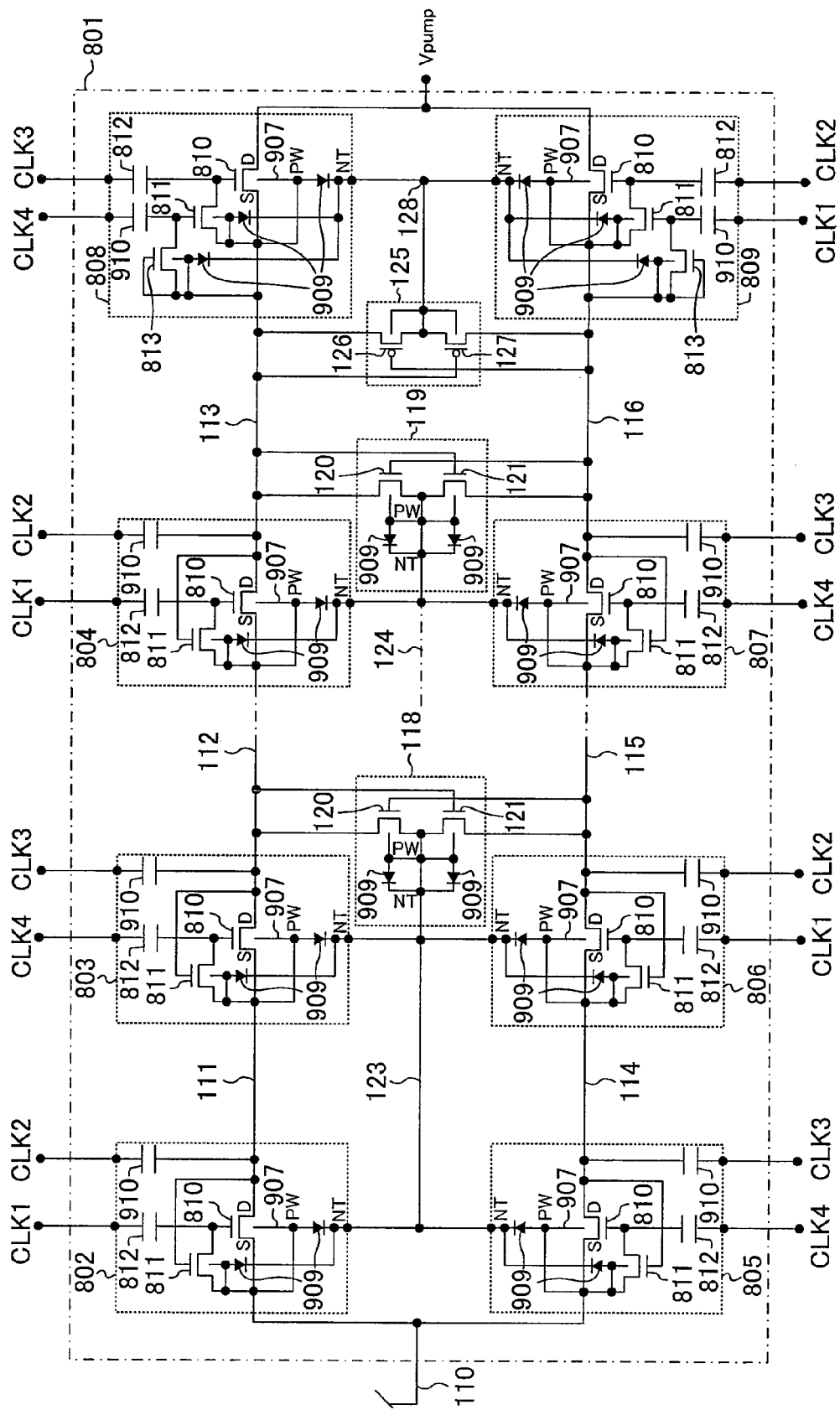
FIG. 7 is a circuit diagram showing still another exemplary configuration of the booster circuit of the present invention.
Figure 8:
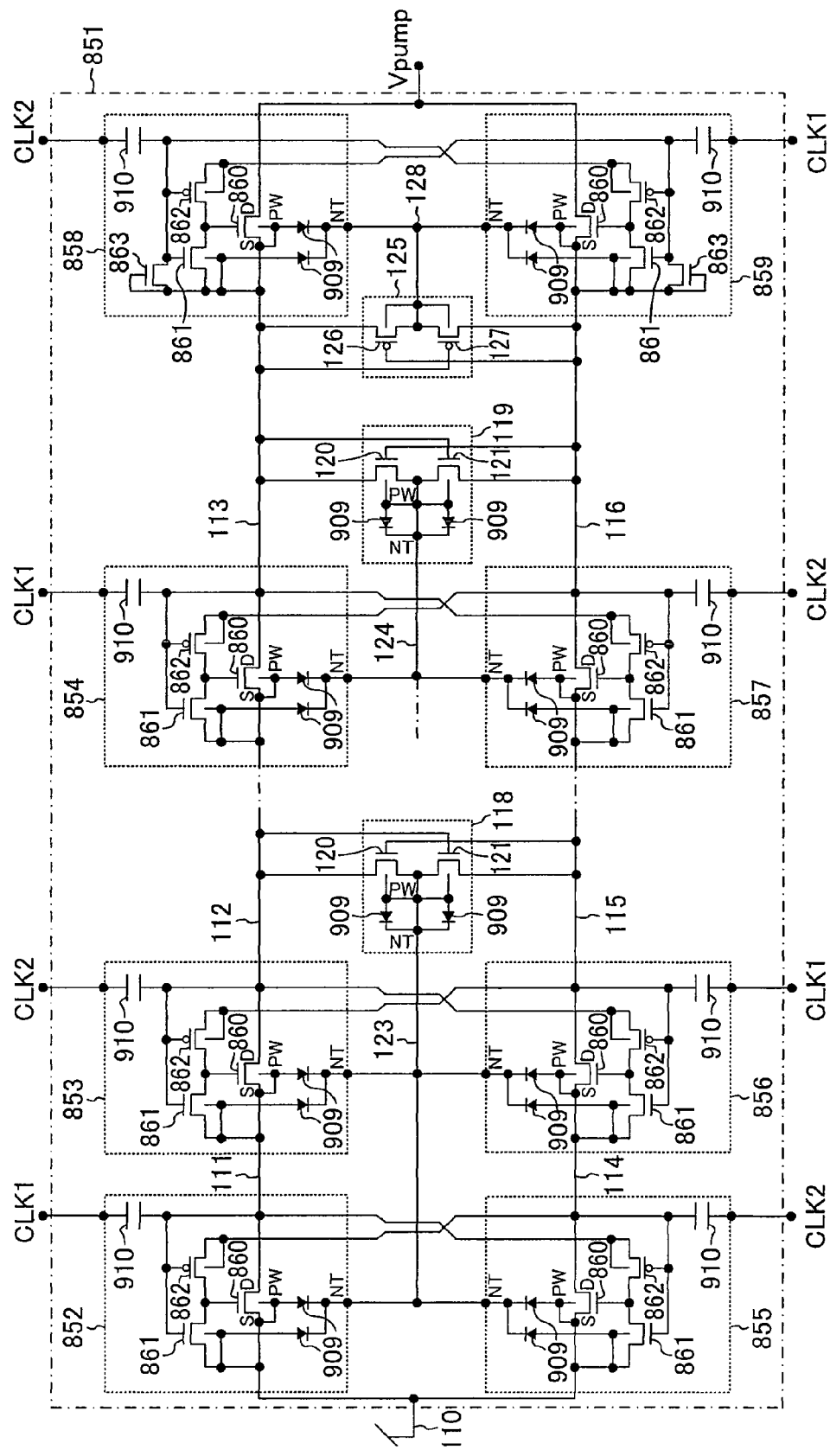
FIG. 8 is a circuit diagram showing still another exemplary configuration of the booster circuit of the present invention.
Figure 9:
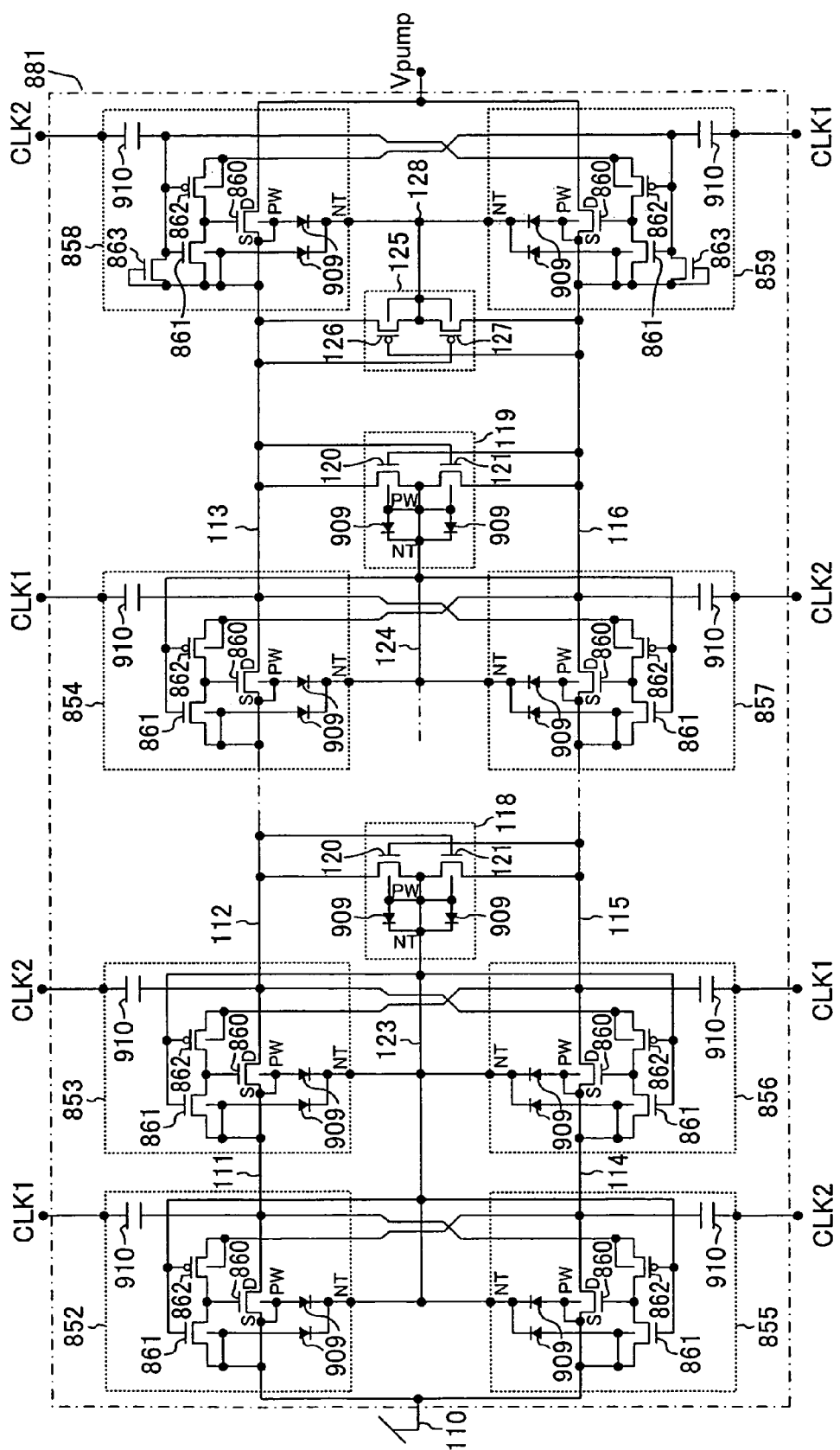
FIG. 9 is a circuit diagram showing still another exemplary configuration of the booster circuit of the present invention.
Figure 10:
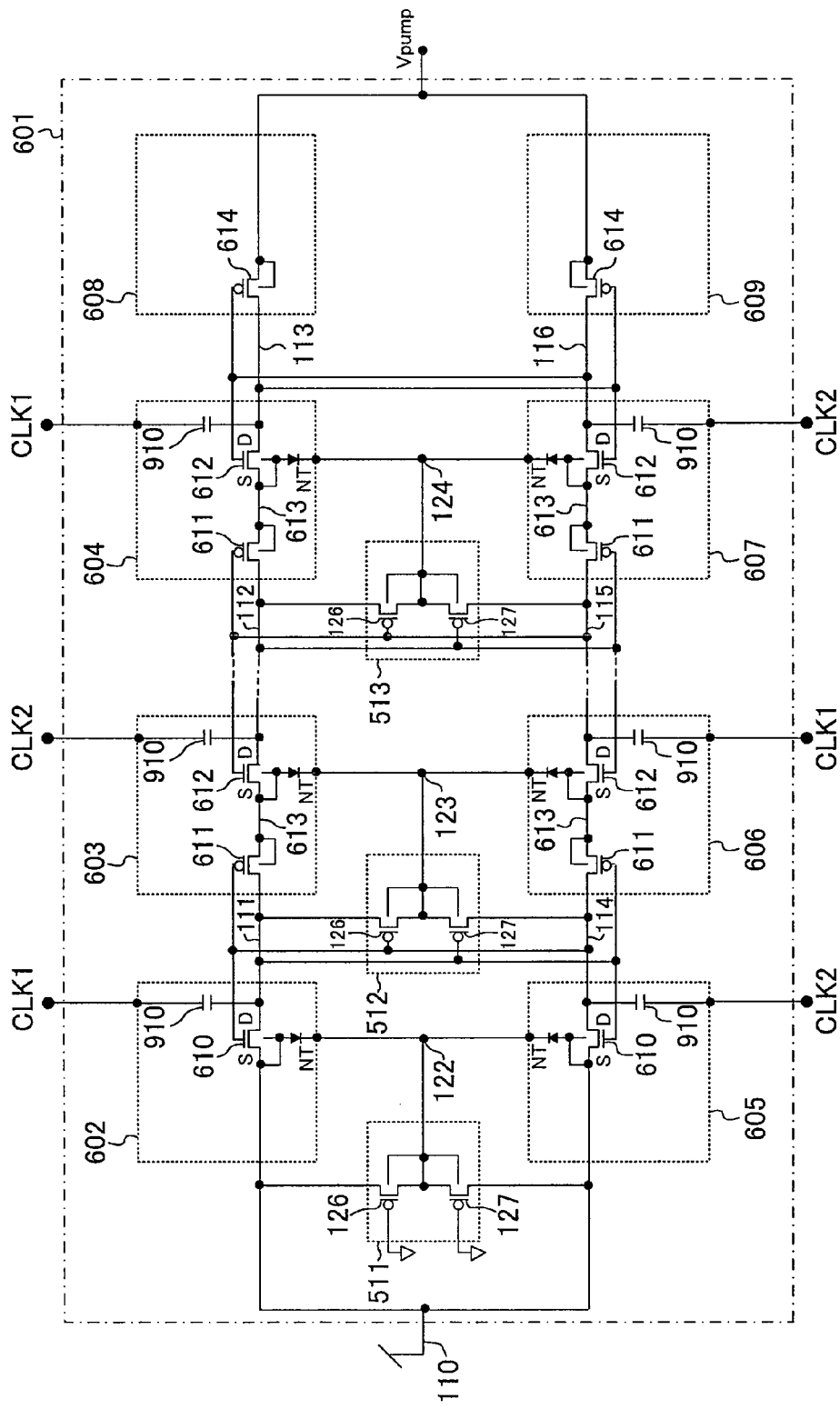
FIG. 10 is a circuit diagram showing still another exemplary configuration of the booster circuit of the present invention.
Figure 11:
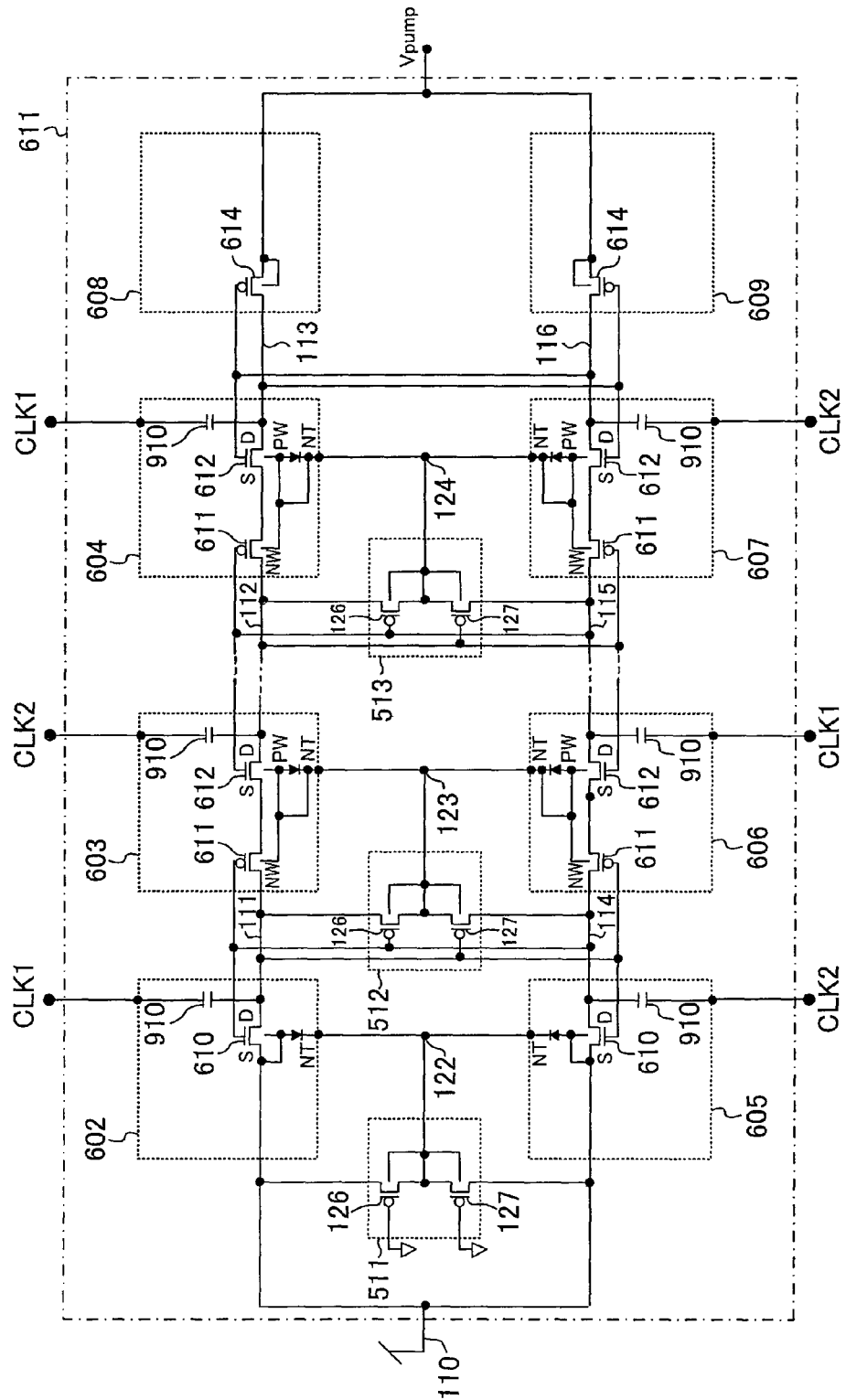
FIG. 11 is a circuit diagram showing still another exemplary configuration of the booster circuit of the present invention.

Thus, the booster circuits employing the two-phase clock signals CLK1 and CLK2 have been described as exemplary booster circuit configurations. Alternatively, as shown in FIG. 7, a booster circuit 801 may employ four-phase clock signals CLK1, CLK2, CLK3, and CLK4. Alternatively, as shown in FIGS. 8, 9, 10, and 11, booster circuit 851, 881, 601, and 611 may employ two-phase clock signals CLK1 and CLK2, and Nch transistors having triple wells in boosting cells, where the low-voltage output analog comparison circuits 117 to 119, and 501 or the high-voltage output analog comparison circuits 511 to 513 and 125 are used, thereby making it possible to a similar effect irrespective of the configuration of the boosting cell. Also, as shown in FIG. 11, the P and N wells of an Nch transistor 612 of each of boosting cells 602 to 607 can be commonly connected, and further, the P and N wells of an Nch transistor 612 and the N well of the Pch transistor 611 can be commonly connected, thereby making it possible to reduce the layout area.

Note that, in FIG. 7, 802, 803, 804, 805, 806, and 807 indicate boosting cells, 808 and 809 indicate backflow preventing circuits, 810 indicates a charge transfer transistor (Nch transistor), 811 and 813 indicates Nch transistors, and 812 indicates a boosting capacitor. In FIG. 8, 852, 853, 854, 855, 856, and 857 indicate boosting cells, 858 and 859 indicate backflow preventing circuits, 860 indicates a charge transfer transistor (Nch transistor), 861 and 863 indicate Nch transistors, and 862 indicates a Pch transistor. In FIGS. 10 and 11, 602, 603, 604, 605, 606, and 607 indicate boosting cells, 608 and 609 indicate backflow preventing circuits, 610 and 612 indicate charge transfer transistors (Nch transistors), 611 and 614 indicate charge transfer transistors (Pch transistors), and 613 indicates a connection node.

Figure 12:
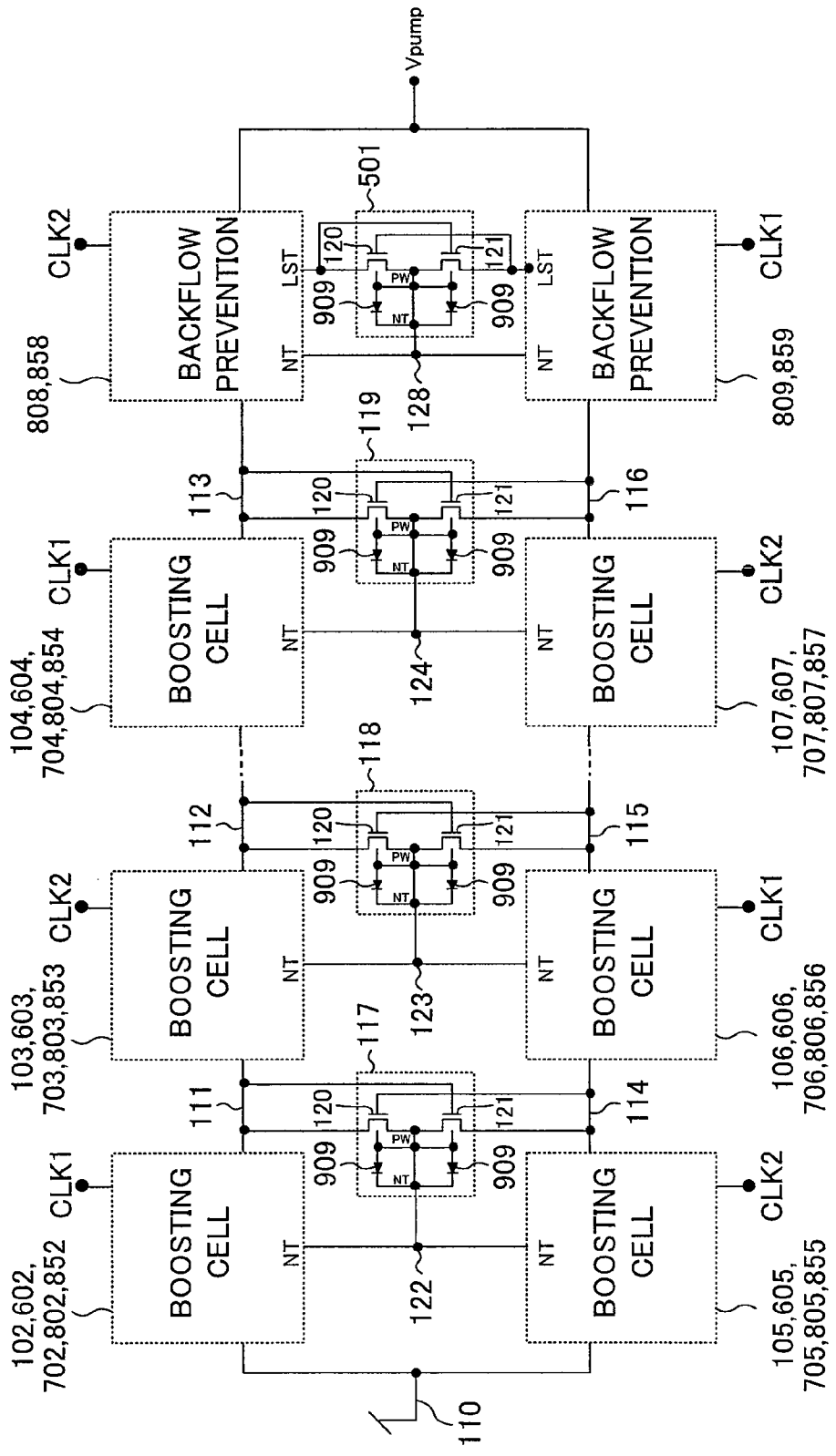
FIG. 12 is a circuit diagram showing still another exemplary configuration of the booster circuit of the present invention.
Figure 13:
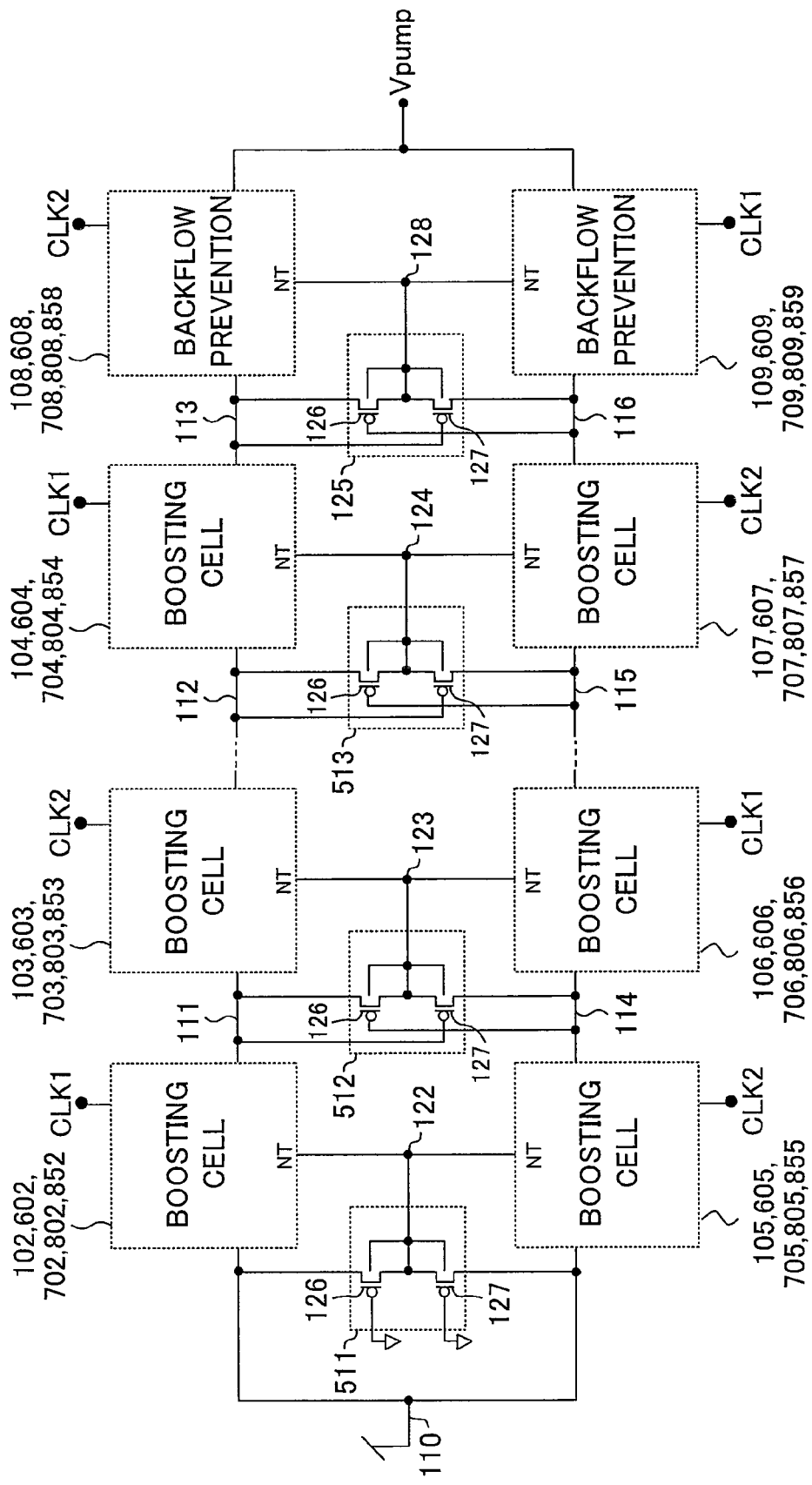
FIG. 13 is a circuit diagram showing still another exemplary configuration of the booster circuit of the present invention.
Figure 14:
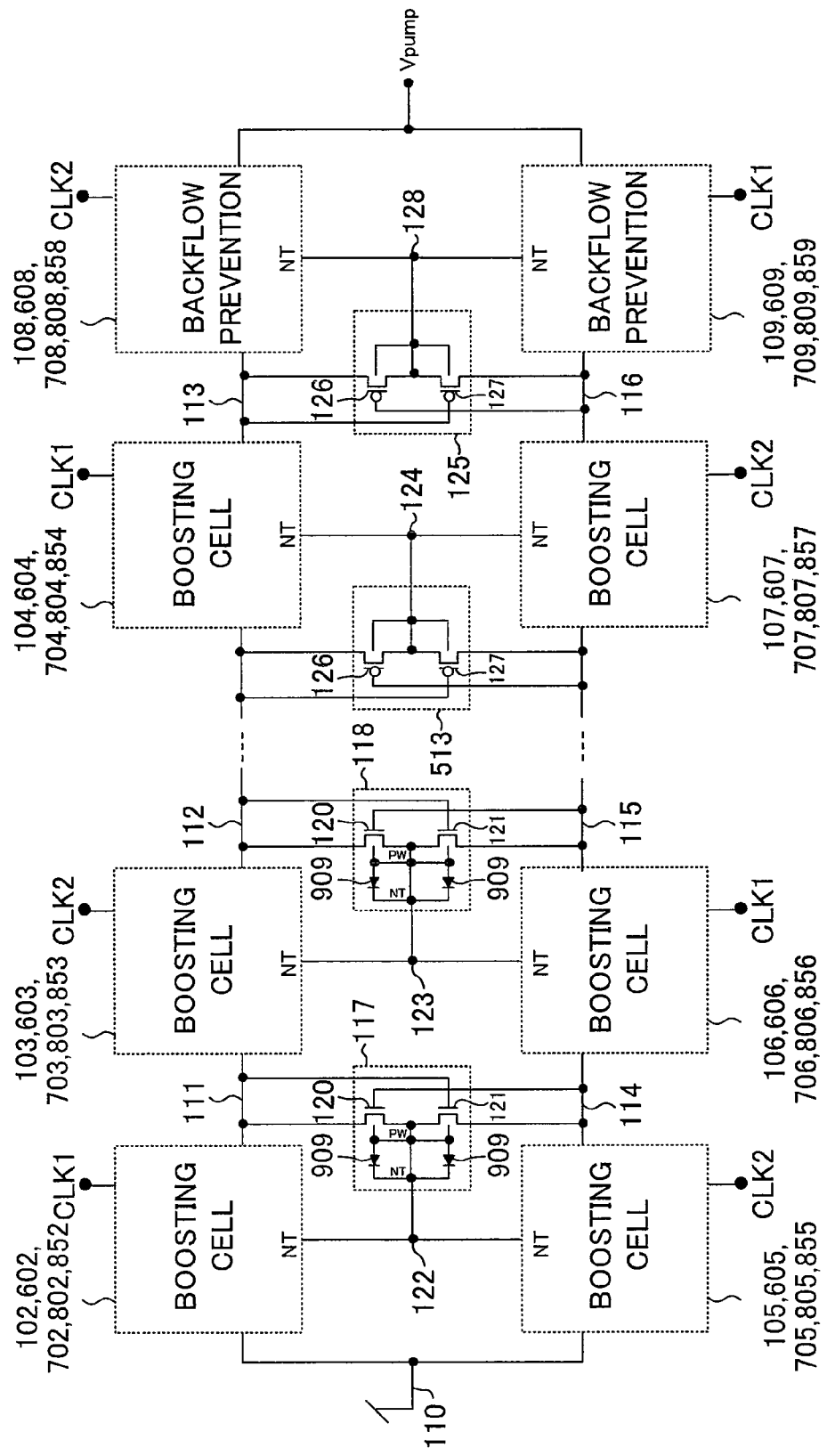
FIG. 14 is a circuit diagram showing still another exemplary configuration of the booster circuit of the present invention.

FIGS. 12, 13, and 14 show exemplary configurations including high-voltage (low-voltage) output analog comparison circuits, where either or both high- and low-voltage output analog comparison circuits can be used for all boosting cells and a backflow preventing circuit. If a boosting operation can be operated irrespective of the number of transistors (charge transfer transistors in the N wells of boosting cells, etc.) or the presence or absence of a Pch transistor and even when the P well is not necessarily connected directly to the source (e.g., the P well of the Nch transistor in a charge transfer transistor or the like is connected to the N well, the potential of the P well is supplied by switching the potentials of the drain and the source, etc.), a similar effect can be achieved.

The configuration of the low-voltage output analog comparison circuits 117 to 119 and 501 and the high-voltage output analog comparison circuits 511, 512, 513, and 125 in the figures is only for illustrative purposes, and any other configurations that provide similar functions may be provided.

Figure 15:
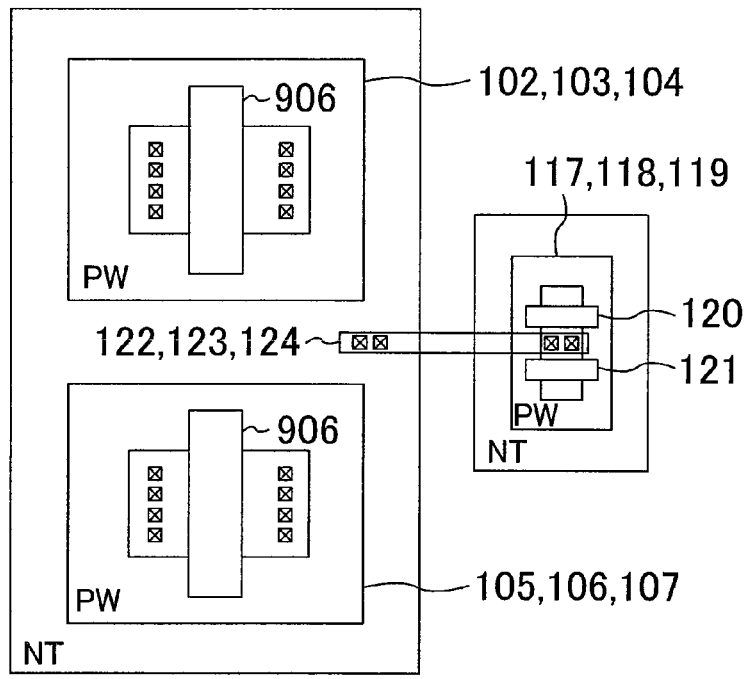
FIG. 15 is a plan view showing an exemplary layout configuration of the booster circuit of the present invention.

FIG. 15 is a plan view showing an exemplary layout configuration of booster circuits according to the present invention, indicating the charge transfer transistors 906 of the boosting cells 102 to 107 and the low-voltage output analog comparison circuits 117 to 119 of FIG. 1.

In FIG. 15, the output terminal 122 (or 123, 124) of the low-voltage output analog comparison circuit 117 (or 118, 119) is connected to a single N well (NT) which is shared by the charge transfer transistors 906 of the boosting cells 102 and 105 (or 103 and 106, 104 and 107).

According to FIG. 15, a single N well can be shared by the triple-well structure switching elements 906 of the two or more boosting cells 102 and 105 controlled by the output voltage of the low-voltage output analog comparison circuit 117, thereby making it possible to reduce the layout area.

Figure 16:
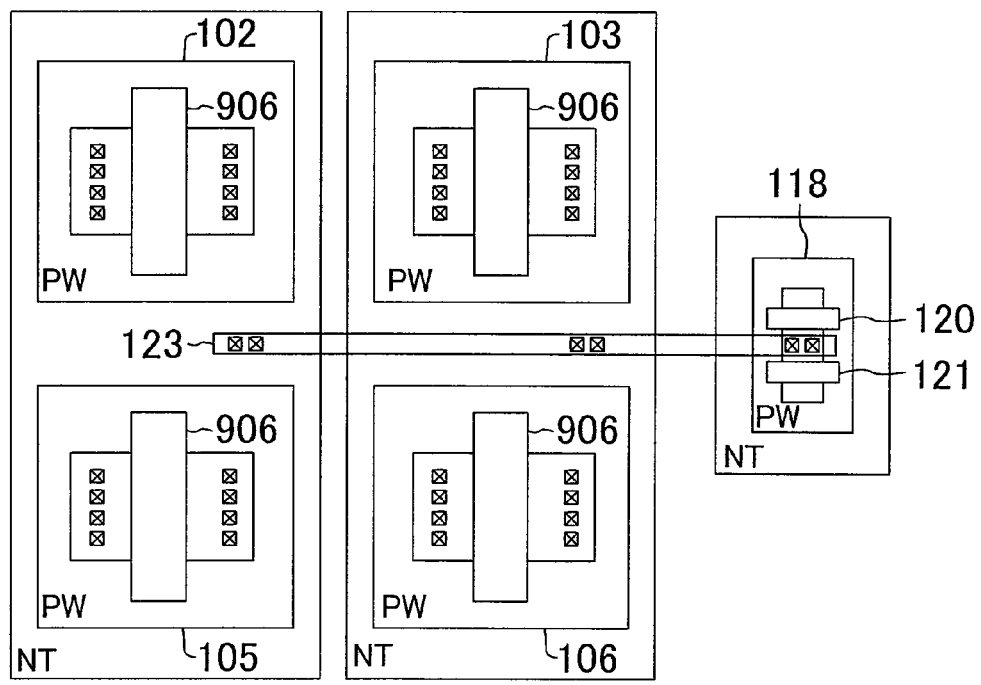
FIG. 16 is a plan view showing another exemplary layout configuration of the booster circuit of the present invention.
Figure 17:
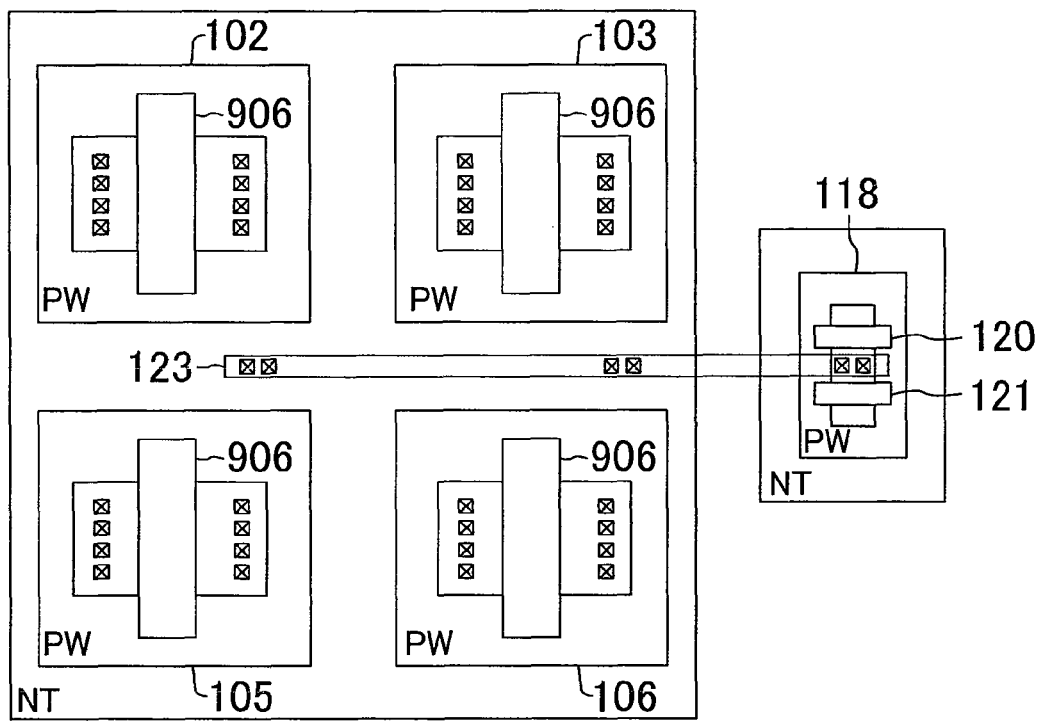
FIG. 17 is a plan view showing still another exemplary layout configuration of the booster circuit of the present invention.

Note that the layout configuration of FIG. 15 is only for illustrative purposes. Alternatively, as shown in FIGS. 16 and 17, the N well of the switching element 906 which is controlled by the output voltage of the low-voltage output analog comparison circuit 118 can be separated or shared irrespective of the number of stages of boosting cells.

Figure 18:
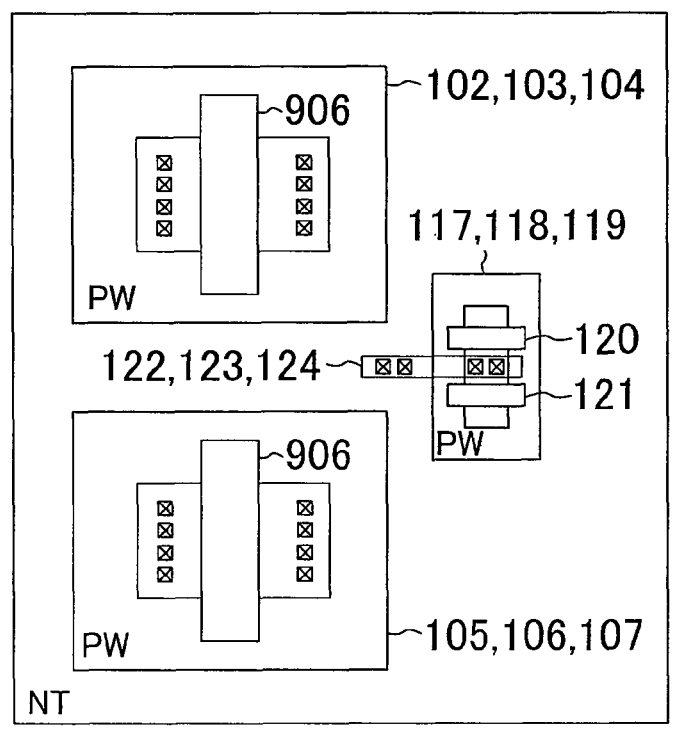
FIG. 18 is a plan view showing still another exemplary layout configuration of the booster circuit of the present invention.
Figure 19:
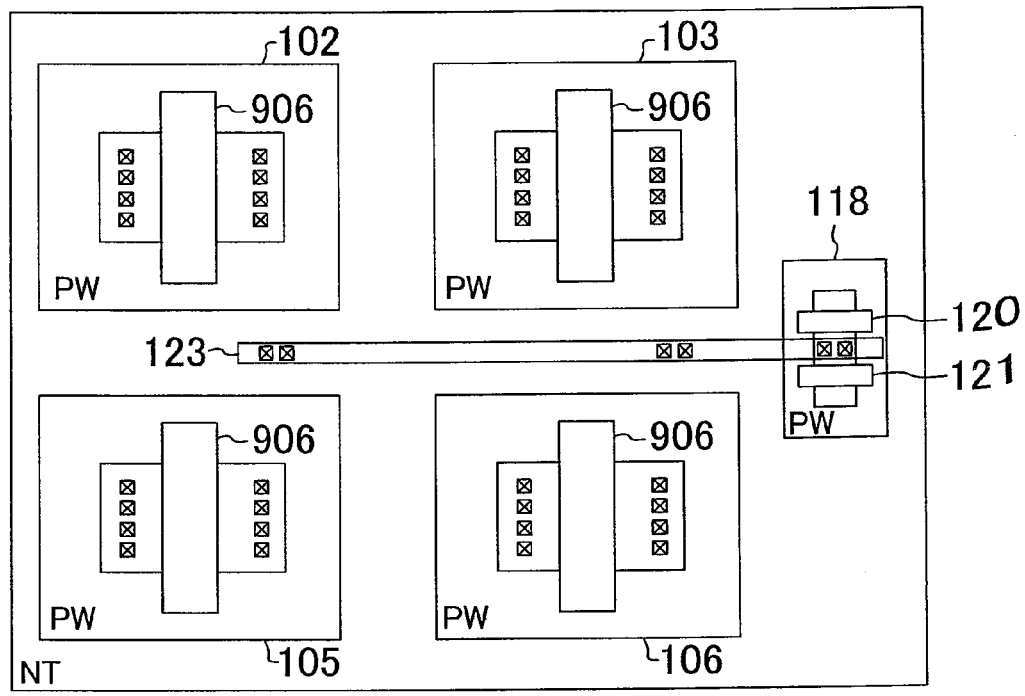
FIG. 19 is a plan view showing still another exemplary layout configuration of the booster circuit of the present invention.

Further, as shown in FIGS. 18 and 19, a single N well can be shared by the low-voltage output analog comparison circuits 117 to 119*u* and the switching elements 906 of the boosting cells 102 to 107, respectively.

Figure 20:
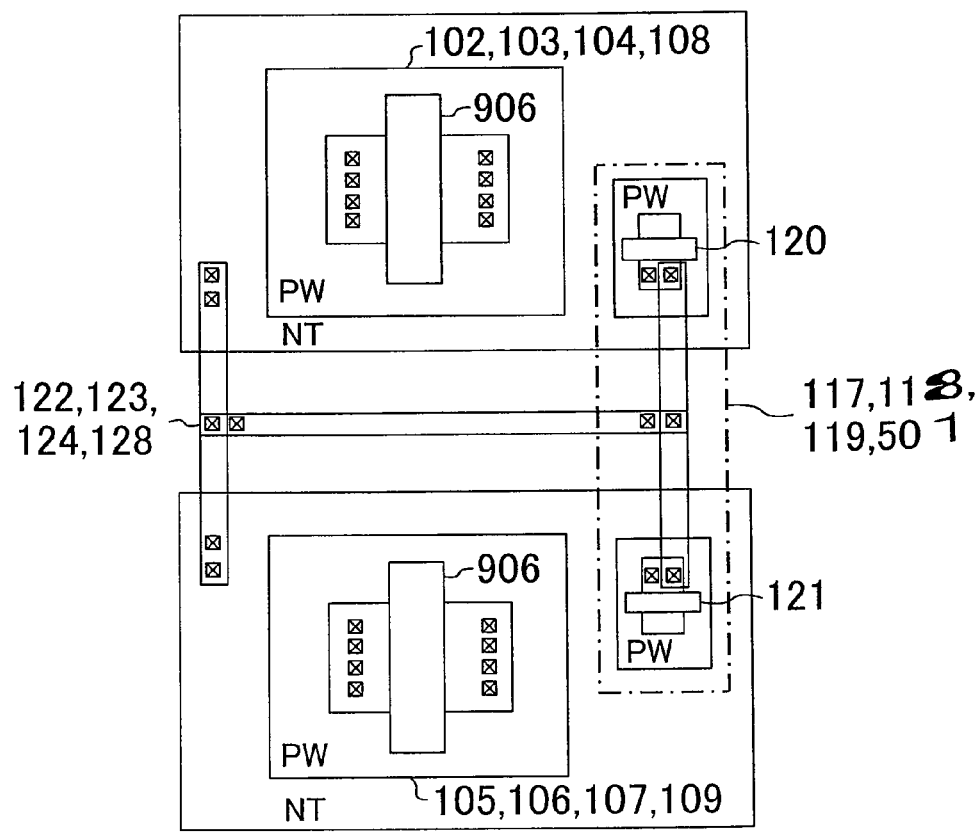
FIG. 20 is a plan view showing still another exemplary layout configuration of the booster circuit of the present invention.
Figure 21:
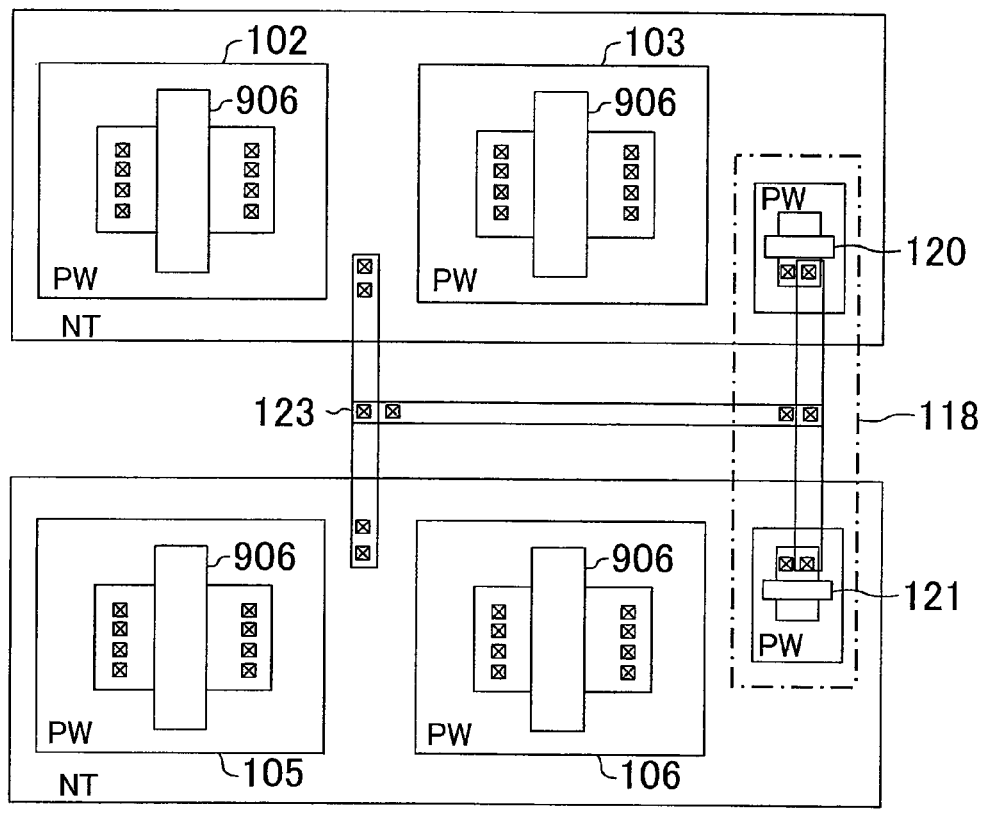
FIG. 21 is a plan view showing still another exemplary layout configuration of the booster circuit of the present invention.

As shown in FIGS. 20 and 21, a single N well is shared by the transistors 120 of the single low-voltage output analog comparison circuits 117, 118, 119, and 501, and the boosting cells 102, 103, and 104 and the backflow preventing circuit 108, and another single N well is shared by the transistors 121 of the low-voltage output analog comparison circuits 117, 118, 119, and 501, and the boosting cells 105, 106, and 107 and the backflow preventing circuit 109. Thereby, the influence of noise in the boosting capacitor can be reduced while decreasing the amount of charges which are charged and discharged of the N well, thereby making it possible to achieve a stable boosting operation.

Figure 22:
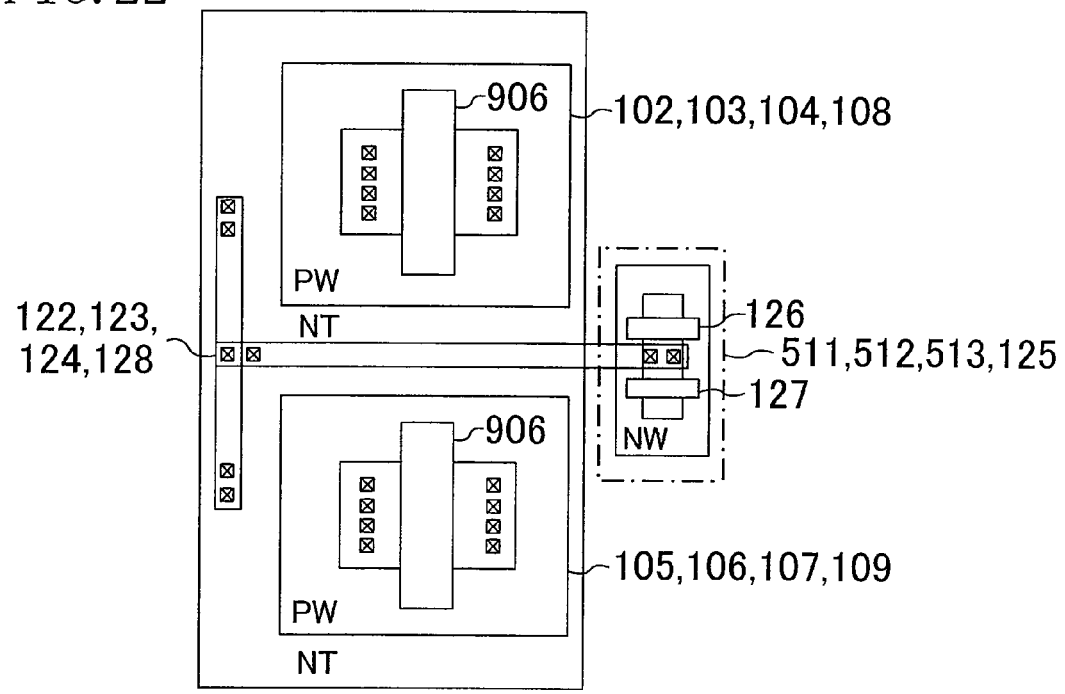
FIG. 22 is a plan view showing still another exemplary layout configuration of the booster circuit of the present invention.
Figure 23:
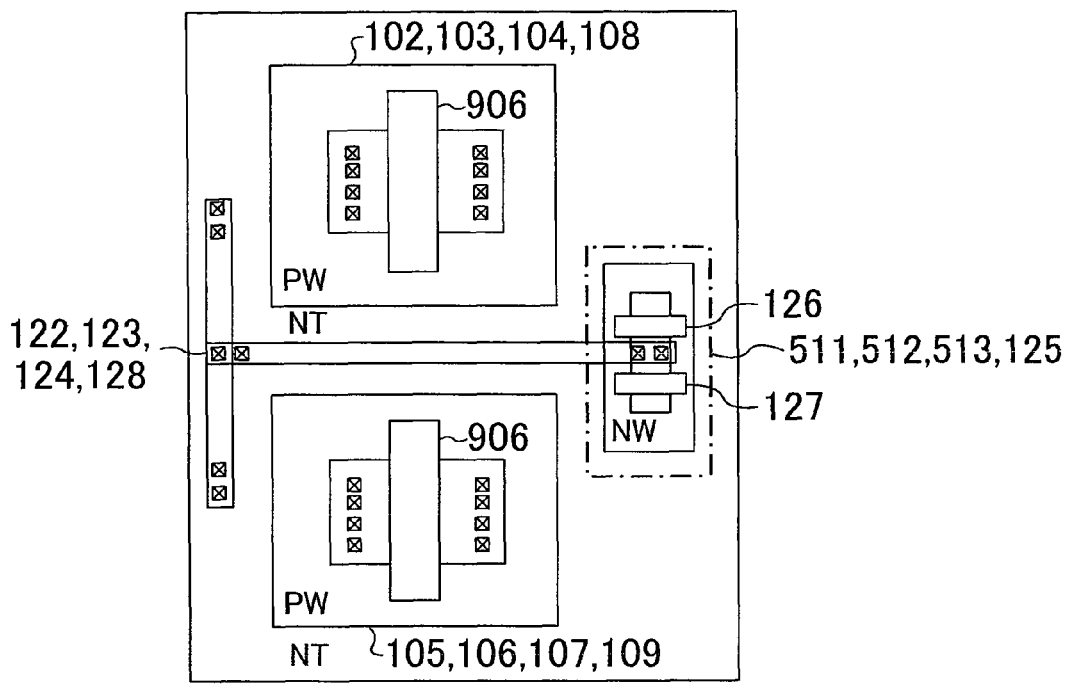
FIG. 23 is a plan view showing still another exemplary layout configuration of the booster circuit of the present invention.
Figure 24:
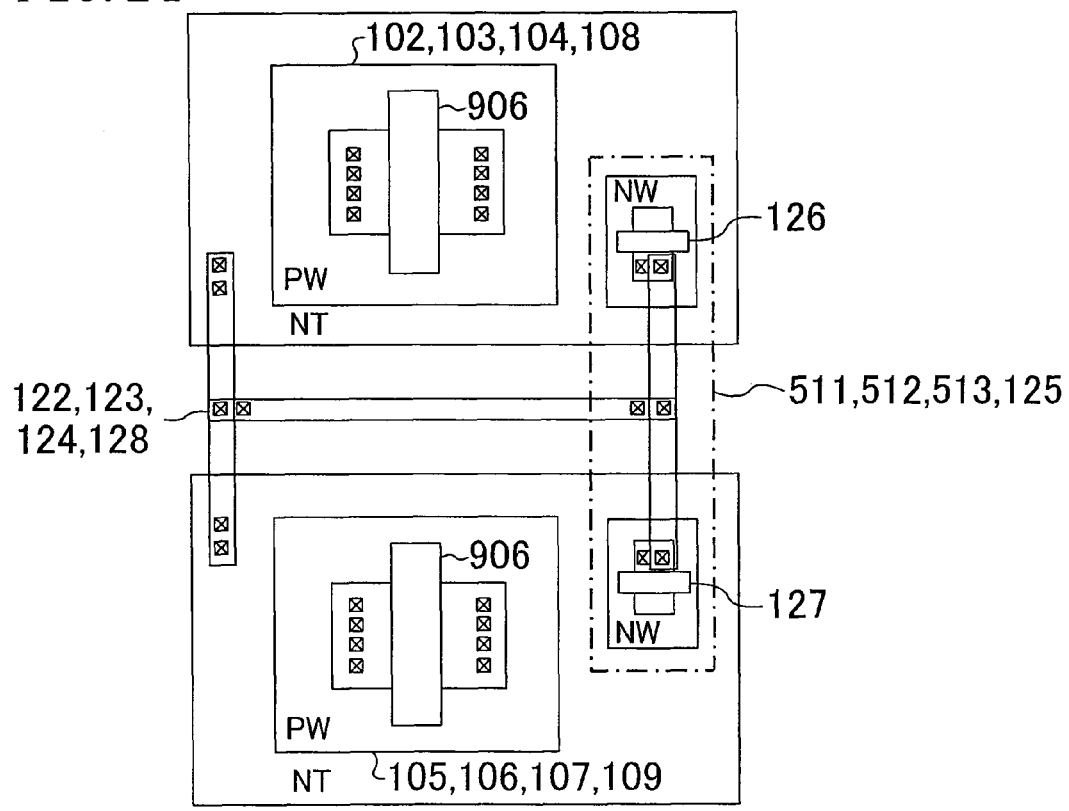
FIG. 24 is a plan view showing still another exemplary layout configuration of the booster circuit of the present invention.
Figure 25:
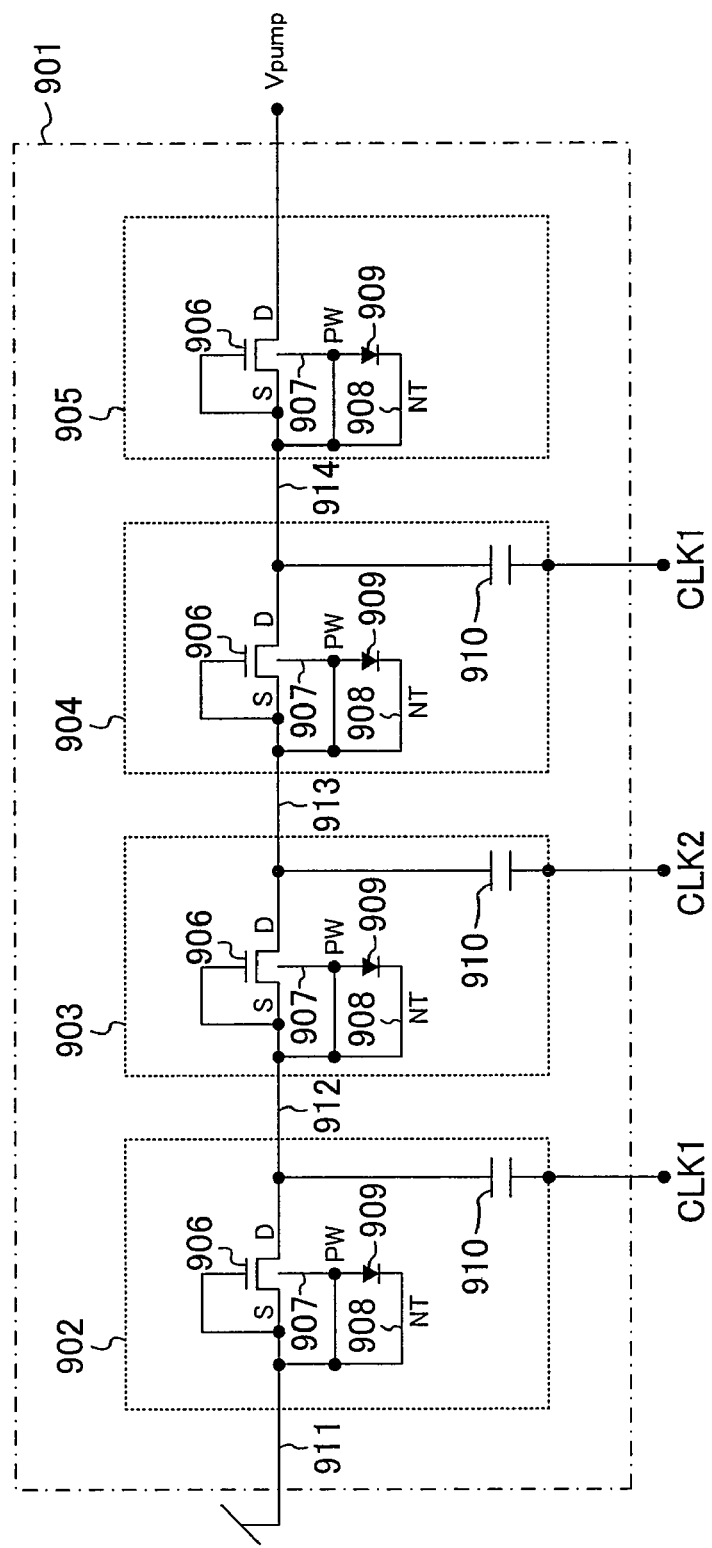
FIG. 25 is a circuit diagram showing a conventional booster circuit.

A similar layout can be applied to the high-voltage output analog comparison circuits 511, 512, 513, and 125 as shown in FIGS. 22, 23, and 24.

The above-described layout is only for illustrative purposes. A plurality of transistors having the same potential can share a single N or P well irrespective of the boosting cell row.

Further, in each of the above aspects, the output voltage generated by the analog comparison circuit in the boosting cell on the i-th stage can be applied to the N well of any of the boosting cells on the (i+1)-th stage, i-th stage, and stages anterior the i-th stage in the booster circuit in the N-th row other than the booster circuits in the first and second rows. This achieves not only reduction in area of the analog comparison circuit but also layout sharing to thus reduce the layout area.

As described above, in the booster circuit of the present invention, the substrate biasing effect can be suppressed in the triple-well structure element included in each boosting cell, so that the current consumption, the circuit area, and the layout area can be reduced. Therefore, the booster circuit of the present invention is useful as a power supply generating circuit or the like for improving analog circuit characteristics in a non-volatile semiconductor memory device and a CMOS process.

Also, the booster circuit of the present invention is applicable to power supply circuits for a volatile semiconductor memory device (DRAM, etc.), a liquid crystal device, a mobile device, and the like.

What is claimed is:

1. A booster circuit comprising:
    boosting cells each having a first-conductivity type first well region on a substrate, a second-conductivity type second well region in the first well region, and at least one switching element in either or both of the first well region and the second well region, wherein the at least one switching element switches to transfer charges from a first terminal to a second terminal;
    a first boosting cell row including N stages (N≧1) of the boosting cells;
    a second boosting cell row including M stages (M≧1) of the boosting cells; and
    at least one analog comparison circuit for outputting a well bias potential generated by an output potential of the boosting cell on the i-th stage (1≦i≦N) of the first boosting cell row and an output potential of the boosting cell on the i-th stage (1≧i≧M) of the second boosting cell row,
    wherein the well bias potential of the at least one analog comparison circuit is applied to the first well region of the switching element included in the at least one boosting cell of the first and second boosting cell rows.

2. The booster circuit of claim 1, wherein;
    the first boosting cell row includes N stages (N≧1) of the boosting cells and at least one backflow preventing circuit;
    the second boosting cell row includes M stages (M≧1) of the boosting cells and at least one backflow preventing circuit; and
    the well bias potential of the at least one analog comparison circuit is applied to the first well region of the switching element included in the at least one backflow preventing circuit of the first and second boosting cell rows.

3. The booster circuit of claim 1, wherein the well bias potential is the higher potential out of the output potential of the boosting cell on the i-th stage (1≦i≦N) of the first boosting cell row and the output potential of the boosting cell on the i-th stage (1≦i≦M) of the second boosting cell row.

4. The booster circuit of claim 1, wherein the well bias potential is the lower potential out of the output potential of the boosting cell on the i-th stage; (1≦i≦N) of the first-boosting cell row and the output potential of the boosting cell on the i-th stage (1≦i≦M) of the second boosting cell row.

5. The booster circuit of claim 1, wherein the second well region and the first terminal are connected to each other so that the second well region and the first terminal have the same potential.

6. The booster circuit of claim 1, wherein the second well region and the first well region are connected to each Other so that the second well region and the first well region have the same potential.

7. The booster circuit of claim 1, wherein
    the at least one analog comparison circuit has a first-conductivity type first well region on the substrate, a second-conductivity type second well region in the first well region, and at least one switching element in the first well region or the second well region, and
    the at least one analog comparison circuit is provided one for each boosting cell stage.

8. The booster circuit of claim 1, wherein
    the at least one analog comparison circuit has a first-conductivity type first well region on the substrate, a second-conductivity type second well region in the first well region, and at least one switching element in the first well region or the second well region, and at least one analog comparison circuit is provided for the first and second boosting cell rows, and
    the at least one analog comparison circuit is provided one every arbitrary number of boosting cell stages.

9. The booster circuit of claim 1, wherein a diode element is provided between the first terminal and the first well region of the boosting cell.

10. The booster circuit of claim 1, wherein the at least one switching elements having the same potential of the first well region of the first and second boosting cell rows share a common first well region.

11. The booster circuit of claim 1, wherein the at least one switching elements having the same potential of the first well region of the first and second boosting cell rows and the at least one analog comparison circuit share a common first well region.

12. The booster circuit of claim 1, wherein
    the at least one switching circuit of the boosting cell on the i-th stage of the first boosting cell row and a first element of the at least one analog comparison circuit share a common first well region, and the at least one switching circuit of the boosting cell on the i-th stage of the second boosting cell row and a second element of the at least one analog comparison circuit share a common first well region.

13. A booster circuit comprising:

boosting cells and backflow preventing circuits each having a first-conductivity type first well region on a substrate, a second-conductivity type second well region in the first well region, and at least one switching element in either or both of the first well region and the second well region, wherein the at least one switching element switches to transfer charges from a first terminal to a second terminal;

a first boosting cell row including N stages (N≧1) of the boosting cells and the backflow preventing circuit;

a second boosting cell row including M stages (M≧1) of the boosting cells and the backflow preventing circuit; and at least one analog comparison circuit for outputting the well bias potential generated by an intermediate potential of the backflow preventing circuit of the first boosting cell row and an intermediate potential of the backflow preventing circuit of the second boosting cell row, wherein the well bias potential of the at least one analog comparison circuit is applied to the first well region of the switching element included in the at Least one backflow preventing circuit, the boosting cell on the (i+1)-th stage, the boosting cell on the i-th stage, or at least one of the boosting cells on less than i-th stages of the first and second boosting cell rows.

14. A booster circuit comprising:

boosting cells each having a first-conductivity type first well region on a substrate, a second-conductivity type second well region in the first well region, and at least one switching element in either or both of the first well region and the second well region, wherein the at least one switching element switches ON/OFF a connection between a first terminal and a second terminal so as to transfer charges from the first terminal to the second terminal;

a first boosting cell row including N stages (N≧1) of the boosting cells; and a second boosting cell row including M stages (M≧1) of the boosting cells;

wherein a potential of the first well region of the at least one switching element included in the boosting cells in the first and second boosting cell rows is controlled according to an output potential of the boosting cells of the first boosting cell row and an output potential of the boosting cells of the second boosting cell row.

15. The booster circuit of claim 1, wherein an output potential of the analog comparison circuit is applied to the first well region of the at least one switching element included in a boosting cell of a boosting cell row different from the first and second boosting cell rows.

\* \* \* \* \*